(12) United States Patent
Kadonoff

(10) Patent No.: US 10,031,166 B2
(45) Date of Patent: Jul. 24, 2018

(54) ELECTRICAL CURRENT MEASURING APPARATUS AND METHOD

(71) Applicant: Michael Jordan Kadonoff, Toronto (CA)

(72) Inventor: Michael Jordan Kadonoff, Toronto (CA)

(73) Assignee: Lynary Enterprises Inc., Toronto (CA)

( * ) Notice: Subject to any disclaimer, the term of this patent is extended or adjusted under 35 U.S.C. 154(b) by 316 days.

(21) Appl. No.: 14/502,147

(22) Filed: Sep. 30, 2014

(65) Prior Publication Data

US 2015/0108966 A1 Apr. 23, 2015

Related U.S. Application Data

(60) Provisional application No. 61/884,994, filed on Sep. 30, 2013.

(51) Int. Cl.
*G01R 15/18* (2006.01)
*H02J 7/00* (2006.01)
*G01R 22/10* (2006.01)
*G01R 19/00* (2006.01)
*G01R 21/133* (2006.01)

(52) U.S. Cl.
CPC ............. *G01R 22/10* (2013.01); *G01R 19/00* (2013.01); *G01R 19/0092* (2013.01); *G01R 21/133* (2013.01); *H02J 7/00* (2013.01)

(58) Field of Classification Search
CPC ............ G01R 22/10; G01R 19/00; H02J 7/00
USPC ..................................... 324/127; 702/50–69
See application file for complete search history.

(56) References Cited

U.S. PATENT DOCUMENTS

| 4,300,182 A * | 11/1981 | Schweitzer, III | ...... G01R 21/00 |
| | | | 324/141 |
| 5,345,169 A | 9/1994 | Etter | |
| 5,610,512 A | 3/1997 | Selcuk | |
| 5,614,807 A * | 3/1997 | Duley | ............. G01R 19/16542 |
| | | | 324/428 |
| 6,072,994 A * | 6/2000 | Phillips | ................. G01S 13/767 |
| | | | 375/219 |
| 6,548,998 B1 | 4/2003 | Gudel | |
| D511,112 S | 11/2005 | Takada | |
| 7,005,778 B2 | 2/2006 | Pistor | |

(Continued)

FOREIGN PATENT DOCUMENTS

EP 1703289 B1 11/2010

*Primary Examiner* — Melissa Koval
*Assistant Examiner* — Rahul Maini
(74) *Attorney, Agent, or Firm* — Bereskin & Parr LLP/S.E.N.C.R.L., s.r.l.

(57) ABSTRACT

An apparatus for electrical current measurement. The apparatus may include a power input such as a current transformer that can be magnetically coupled to a line being measured. The apparatus may also include an energy harvesting circuit to parasitically harvest energy from the current transformer and an energy metering circuit to measure the current on the line. A controller can control the switching of a dynamic switch between an energy harvesting mode and an energy metering mode. The apparatus may also include a wireless transceiver. A plurality of these apparatuses may be combined into a network of devices to relay information from multiple current meters to a data concentrator and ultimately the Internet.

27 Claims, 15 Drawing Sheets

(56) References Cited

U.S. PATENT DOCUMENTS

| | | | |
|---|---|---|---|
| 7,174,261 B2* | 2/2007 | Gunn | G01R 21/133 324/547 |
| 7,193,408 B2 | 3/2007 | Cattaneo et al. | |
| 7,230,532 B2 | 6/2007 | Albsmeier et al. | |
| 7,298,131 B2 | 11/2007 | Jones | |
| 7,391,135 B2 | 6/2008 | Schmidt | |
| 7,492,145 B2 | 2/2009 | Lepine et al. | |
| 7,622,909 B2 | 11/2009 | Teppan | |
| 7,746,068 B2 | 6/2010 | Mahon | |
| 8,253,389 B2* | 8/2012 | Ivanov | H02J 7/0029 307/80 |
| 8,558,660 B2* | 10/2013 | Nix | H04Q 9/00 340/10.1 |
| 8,611,062 B2* | 12/2013 | Bishop | G01R 15/183 361/93.6 |
| 8,939,928 B2* | 1/2015 | Savoie | A61M 5/14248 604/65 |
| 2008/0316003 A1 | 12/2008 | Barnett et al. | |
| 2009/0015239 A1* | 1/2009 | Georgiou | G01R 15/14 324/105 |
| 2010/0087217 A1 | 4/2010 | Lopez de Arroyabe et al. | |
| 2010/0153036 A1 | 6/2010 | Elwarry et al. | |
| 2010/0244868 A1 | 9/2010 | Cantave et al. | |
| 2010/0264906 A1 | 10/2010 | Shamir et al. | |
| 2010/0318306 A1* | 12/2010 | Tierney | G01R 22/063 324/156 |
| 2011/0178640 A1 | 7/2011 | Schmidt | |
| 2011/0291488 A1 | 12/2011 | Paik et al. | |
| 2012/0161713 A1* | 6/2012 | Kim | H02J 3/32 320/134 |
| 2013/0211783 A1* | 8/2013 | Fisher | G06F 11/30 702/182 |
| 2014/0062471 A1* | 3/2014 | Deak | G01R 21/06 324/252 |
| 2014/0062672 A1* | 3/2014 | Gudan | G06K 19/0723 340/10.33 |
| 2014/0200843 A1* | 7/2014 | Shamir | G01R 21/133 324/127 |
| 2015/0123654 A1* | 5/2015 | Gagnon | G01R 21/133 324/251 |

* cited by examiner

ELECTRICAL CURRENT MEASURING APPARATUS AND METHOD

This application claims the benefit of U.S. Provisional Application No. 61/884,994 filed Sep. 30, 2013, the entirety of which is incorporated herein by reference.

FIELD

This invention relates to the field of measuring electrical current in general and energy meters and energy metering methods in particular.

BACKGROUND

Metering systems exist for measuring current passing through a conductor, such as a utility wire, including an electrical wire, of an industrial power system, without interrupting the electrical circuit being tested. Such metering systems are typically powered by the radiated power from the power system. Such metering systems are typically used with power systems that provide steady power. For example, these metering systems are often used to measure current flowing through utility wires connected to an industrial machine that is in constant operation.

Household power systems, on the other hand tend to have utility wires which are more intermittently powered. One such example is an electrical cord connected to a reading light. When the light is on, power is available in the cord; when the light is off, power is not available in the cord. Such intermittent loading presents challenges not typically found in industrial electrical current metering. For example, metering systems used with such intermittent loads may go long periods without being able to harvest radiated energy from the utility wires.

SUMMARY

In a first aspect, some embodiments of the invention provide an apparatus for measuring the electrical current provided by a power source that is further operable to harvest energy from the metered power source.

The apparatus can include an AC power input and a dynamic switch coupled to the power input. An energy harvesting circuit and an energy metering circuit can be coupled to the dynamic switch. A controller can be coupled to the dynamic switch that is operable to control switching of the dynamic switch. The dynamic switch can be configured to activate one of the energy harvesting circuit and the energy metering circuit, and deactivate the other.

In some embodiments, the AC power input can be a current transformer adapted to be magnetically coupled to a utility wire.

In some embodiments, the dynamic switch can be configured to activate the energy harvesting circuit in the absence of an active controller.

In some embodiments, the energy harvesting circuit can include an energy storage medium. The energy storage medium may be a solid state lithium cell.

In some embodiments, the controller can be coupled to the energy storage medium, and the energy storage medium can be configured to provide power to the controller.

In some embodiments, the energy harvesting circuit can be configured to charge the energy storage medium using current received from the power inputs.

In some embodiments, the energy harvesting circuit may also include a harvest controller coupled to the energy storage medium and a voltage rectifier coupled to the harvest controller. The voltage rectifier may be configured to rectify the received current into pulsed DC current and supply the pulsed DC current to the harvest controller. The harvest controller may be configured to charge the energy storage medium using the pulsed DC current.

In some embodiments, the energy harvesting circuit may also include a boost converter coupled between the voltage rectifier and the harvest controller. The boost converter can be configured to boost an input voltage of the pulsed DC current prior to supplying boosted DC current to the energy storage medium and/or the controller.

In some embodiments, the energy metering circuit can include an analog front end configured to measure a differential signal of the received AC current.

In some embodiments, the analog front end can include a noise suppression and protection circuit.

In some embodiments, the analog front end can include a burden resistor. The analog front end can be configured to measure a voltage signal across the burden resistor.

In some embodiments, the analog front end can include a voltage bias circuit to bias the measured voltage signal to a ground referenced voltage signal.

In some embodiments, the analog front end can include a voltage amplifier.

In some embodiments, the analog front end can include an anti-aliasing filter.

In some embodiments, the energy metering circuit can include an analog-to-digital converter (ADC) configured to digitize the voltage signal from the analog front end.

In some embodiments, each component in the energy metering circuit and analog front end may include an independent power switch.

In some embodiments, the ADC may have a sampling rate of n times a nominal utility frequency, where n is an integer.

In some embodiments, the apparatus may include a voltage regulator coupled to the controller, the energy harvesting circuit and the energy metering circuit. The voltage regulator may be operable to provide a regulated source of power for the controller and the energy metering circuit.

In some embodiments, the apparatus may also include a voltage divider coupled between the battery and the energy harvesting circuit. The voltage divider can be configured to ensure a minimum energy level in the energy storage medium prior to activating the voltage regulator.

In some embodiments, the energy harvesting circuit can be configured to automatically activate the voltage regulator and/or controller when the minimum energy storage level is reached.

In some embodiments, the controller or power management and regulation circuits can be configured to operate in a sleep mode and an active mode.

In some embodiments, when the controller or power management and regulation circuit is in the active mode, the voltage regulator can provide a regulated source of power for the controller and when the power management and regulation circuit or the is in the sleep mode, the controller can be powered directly from the energy harvesting circuit.

In some embodiments, the voltage regulator can have a high power regulation mode operable when the controller is in the active mode and a low power regulation mode operable when the controller is in the sleep mode.

In some embodiments, the voltage regulator may have a maximum current draw of 50 µA in the low power regulation mode.

In some embodiments, the voltage regulator may have a maximum current draw of 400 mA in the high power regulation mode.

In some embodiments, the apparatus may also include a wireless transceiver. The controller may further be operable to receive a wireless wake command and to switch operation of the controller from the sleep mode to the active mode upon receiving the wake command.

In some embodiments, there is provided a system comprising a plurality of apparatuses for electrical current measurement. Each of the apparatuses can include a wireless transceiver and may be operable to communicate with at least one of the other apparatuses.

In some embodiments, the system may also include a data concentrator that is operable to wirelessly communicate with at least one of the apparatuses. The plurality of apparatuses can be configured to relay information from each of the apparatuses to the data concentrator. The data concentrator may be operable to further relay the information to the internet or a wider area network.

Further aspects and advantages of the embodiments described herein will appear from the following description taken together with the accompanying drawings.

BRIEF DESCRIPTION OF THE DRAWINGS

A preferred embodiment of the present invention will now be described in detail with reference to the drawings, in which.

DESCRIPTION OF EXEMPLARY EMBODIMENTS

Figure 1:
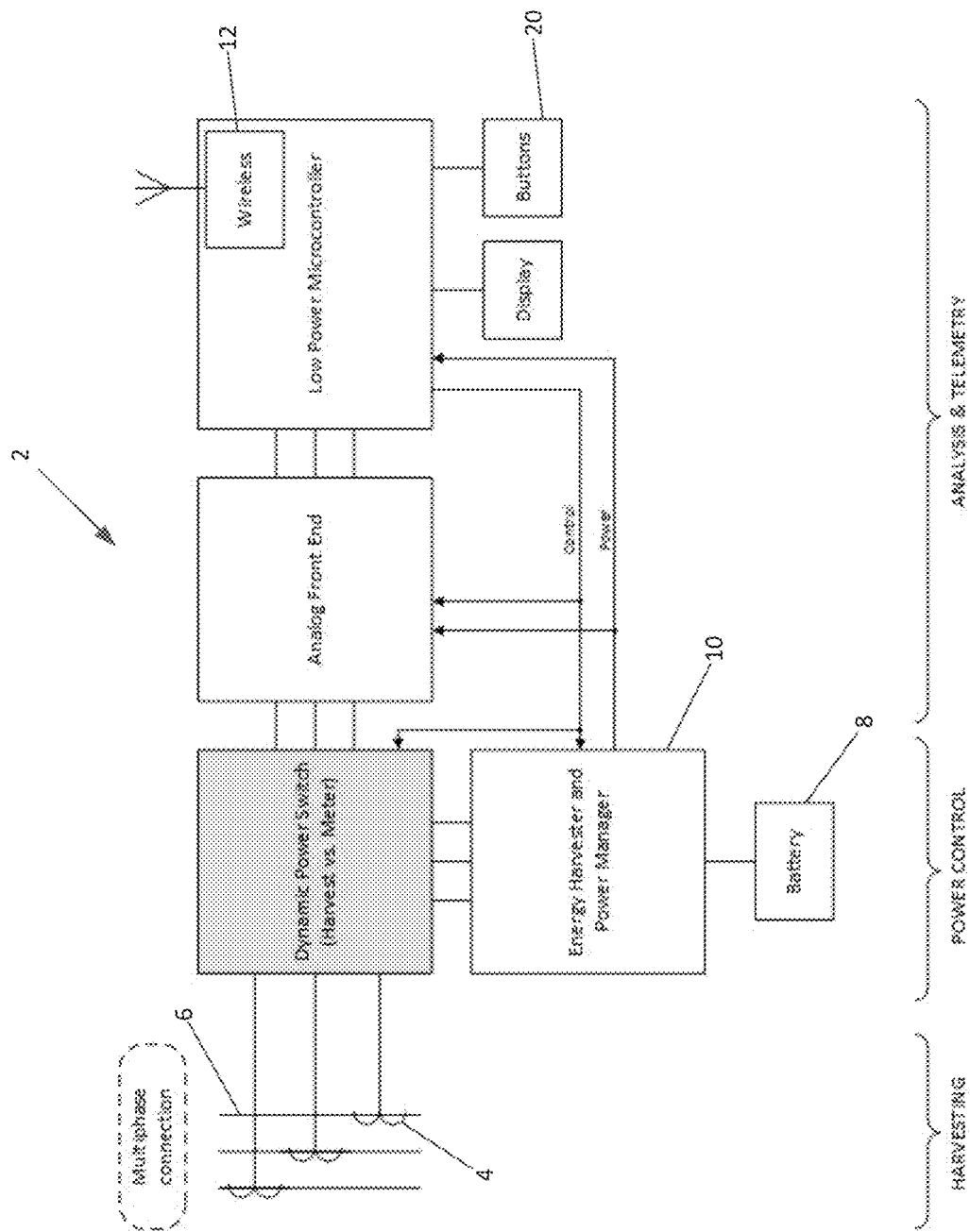
FIG. 1 is a block diagram of a meter system according to an embodiment of the present invention.

The present invention will now be described more fully hereinafter with reference to the accompanying drawings, which are intended to be read in conjunction with both this summary, the detailed description and any preferred and/or particular embodiments specifically discussed or otherwise disclosed. This invention may, however, be embodied in many different forms and should not be construed as limited to the embodiments set forth herein.

Energy metering systems can be used to track energy usage in many settings. For example, homeowners or business owners may wish to track their energy consumption over a period of time and review their energy consumption information. While overall energy consumption information can be obtained using information from a hydro meter or a hydro bill, it may be desirable to have more granular energy consumption information to indicate which appliances consumer the most energy and how much energy those appliances are consuming.

The collected energy consumption information could be used by homeowners and business owners to adjust their energy consumption habits and identify operational efficiencies. Costs could be reduced for the homeowner or business owner by reducing overall energy consumption or adjusting the timing of their energy consumption. Changing energy consumption habits could also result in general environmental benefits if overall energy consumption is reduced.

Energy metering systems can be designed to measure currents passing through electrical wires. For example, current transformers can be magnetically coupled to electrical wires to generate a secondary current proportional to the current passing through the electrical wires. This secondary current can then be used to estimate the energy passing through the electrical wires.

In some cases, energy metering systems can be designed to harvest energy from the electrical wires to power their own operations. The secondary currents generated by the current transformers can be used to charge energy storage mediums that can then be used to power the components of the energy metering systems.

Typically, energy metering systems have been designed using super-capacitors as energy storage medium. One issue with using super-capacitors to store energy for an energy metering system is that they have higher leakage or self-discharge currents. As a result, the energy stored in a super-capacitor will dissipate if the current source being measured is without a load for an extended period of time. Accordingly, these systems may require auxiliary power sources such as primary or non-rechargeable batteries that have to be replaced once they are discharged. This can increase maintenance and initial costs associated with these energy metering systems as well as contribute to toxic landfill.

In embodiments of the energy metering system described herein, the energy storage medium comprises a rechargeable, low leakage lithium-ion cell battery. The lithium secondary cell has a much lower leakage current and can thus retain energy over long periods without a load on the lines. The energy metering system described herein is further configured to recharge the cell using power harvested from the secondary current from the current transformers or other input sources. This approach may reduce or eliminate the need for maintenance or auxiliary power sources once the energy metering system is commissioned.

In an energy metering system, a controller, such as an embedded low power microcontroller, may be used to control the operation of an energy metering circuit or an energy harvesting circuit. To conserve energy for long periods where there is no load on the electrical wires, it may be desirable to deactivate or place the controller into a "sleep" mode to minimize energy drain. Accordingly, an energy metering system may be placed in an inactive or hibernation mode where the system microcontrollers are not powered. A hibernation mode may also occur as a result of a factory ship or when the battery's under voltage threshold for cutoff has been exceeded. In some cases, it may be difficult to ensure that an energy metering system can be activated from an inactive or hibernation state.

In embodiments described herein, the energy metering system can be configured such that it can operate autonomously in the absence of microcontroller control. The dynamic switch can be configured such that the energy harvesting circuit is engaged in the absence of external control. Thus, the energy harvesting circuit itself can be configured to automatically harvest energy from the electrical wires once there is a load on the line. This harvested energy can be used to activate the controllers, power management and regulation circuits.

A further challenge that can be associated with energy metering systems is that the secondary currents used to measure energy consumption can be quite small. As a result, in some cases noise may significantly impact the measurement of the energy passing through the electrical wires.

In embodiments described herein, the energy metering system can be configured to isolate the signal being capture for harvesting from the signal that is metered. This can help prevent distortion of the metered signal.

In some embodiments, a dynamic switch can be used to maximize the current passing through an energy metering circuit when in an energy metering mode. The dynamic switch may be configured such that most, if not all, of the secondary current flows through the energy metering circuit (and not the energy harvesting circuit) while in an energy metering mode. The dynamic switch can also be configured such that most, if not all, of the secondary current flows through the energy harvesting circuit (and not the energy metering circuit) when in an energy harvesting mode.

In some embodiments described herein, the energy metering system can be configured to measure the secondary current passing through the energy metering circuit differentially. This can result in increased signal quality and noise immunity as compared with approaches that measure a common mode current. In other embodiments where a greater signal to noise ratio and common mode range is required, the dynamic metering front end outputs can be connected to the inputs of a single ended (2 or 3 amplifier) instrumentation amplifier.

Referring now to FIG. 1, shown therein is an energy meter system 2 according to an embodiment of the present invention. The energy meter system 2 can be operable to determine an RMS primary current with respect to time. These determined values can be used to compute energy utilization values with defined utility voltages.

The energy meter system 2 may include multiple conventional "clip-on" magnetically coupled current transformers (CTs) 4 for polyphase applications. For example, the energy meter system 2 shown in FIG. 1 includes three CTs 4 though alternative configurations may include n inputs where "n" is an integer. An example of a suitable CT is the YUANXING P/N: CTSA-10 (1:3000). The magnetically coupled CTs 4 can be releasably attachable to feed or return wires 6 within a power system (also referred to herein as the measurement source). An example of such a wire 6 is a household cord for an appliance. The CTs 4 induce a secondary current proportional to the primary current. The induced current within the CTs 4 secondary winding (not shown) can then transformed into voltage across a precision burden or load resistor. This voltage can then be amplified accordingly and digitized with an analog-to-digital converter (ADC) for later processing.

Energy Harvesting

The CTs 4 used with the system 2 are primarily designed to provide an accurate signal reference and not to be a power transformer. Accordingly, the resultant power available on the secondary side of the CTs 4 tends to be on the order of tens to hundreds of microwatts (about a million times less than what a cellphone typically uses) depending on the CT configuration. The energy meter system 2 can be configured to harvest the resultant power obtained from the CTs 4 to power its own operation The energy available to be harvested by the energy meter system 2 is directly proportional to the amount of energy in the wires 6 being measured when using a CT. In certain embodiments, a "no load" situation in the wires 6 may still be metered. In a no load situation there is insufficient energy obtainable from the wires 6 to power the energy meter system 2. A battery 8 can be provided to provide power to the energy meter system 2 in such situations. The battery 8 can also be used to power the energy meter system 2 where there is a load on wires 6 but insufficient energy can be harvested to operate the energy meter system 2.

In order to charge the battery 8, energy from the wires 6 is used ("harvested") to charge the battery 8 when there is excess energy available beyond what is required to operate the energy meter system 2. Energy from the secondary side of the CTs can be passed through a rectifier. The rectified CT current can then be routed to an energy harvester and power management controller 10 and ultimately the battery 8. The battery 8 may be a suitable battery such as a specialized lithium-based energy storage medium which has suitable peak ampacity/leakage characteristics. The battery 8 may be a suitable battery working in parallel with low ESR (equivalent series resistance) capacitors to provide a lower impedance path for power draws in excess of the capacity of the battery 8. Storing excess energy harvested from the wires 6 allows the energy meter system 2 to be run from the battery 8, such as when there is insufficient energy in the metered source to run the energy meter system 2. The battery 8 can also provide a sufficiently strong, low impedance power source to power a wireless transceiver 12 when transmitting or receiving data. In some embodiments, the wireless transceiver 12 may have the highest power consumption of any circuit block within the energy meter system 2. In some cases, operation of the wireless transceiver 12 without any power being supplied by the battery 8 could cause a board level "brownout".

In certain embodiments of the present invention, the energy meter system 2 can be configured such that periods with a load on the lines 6 can be used to build charge within the battery 8 with no loss of metering fidelity. In some cases, it can be preferable to operate the energy harvesting circuit when the wires 6 are under a steady load such as when being used to run an appliance such as lighting, an air conditioner or the like. In certain other embodiments of the present invention, the energy meter system 2 can be configured such that storage of excess energy permits greater power budgeting flexibility to achieve the maximal wireless bandwidth possible based on the available power from the metering source as well as the battery state of charge ("SOC").

In certain embodiments, a CT with a built in burden resistor may be used. In such cases, the analog front end circuit will not need a built in burden resistor and will depopulate it from the printed circuit board. Using this type of unburdened CT may result in a significant reduction in the amount of harvestable energy. Furthermore, the gain of the analog front end amplifiers may be adjusted to accommodate a different transformation ratio. In other embodiments, the amplifier gain may be made to be adjustable through the use of a programmable gain amplifier.

In some embodiments, a controller of the energy meter system 2 controls a dynamic switch to automatically transition between being in an energy harvesting mode and being in a metering mode. In the energy harvesting mode, power from the metered source can be harvested to power the system 2 and/or charge the battery 8. For example, the energy harvesting mode may be active at least until the battery 8 is sufficiently charged to be able to power the system 2. In the metering mode the current in the metered source can be measured.

In some embodiments, the energy metering system 2 may be configured to operate primarily in the energy harvesting mode. The controller (as a function of the application and/or configuration) may determine that the wires 6 do not warrant measurement where there is a steady state load on the wires 6. A steady state load may represent constant energy consumption through the wires 6 or a cyclic consumption pattern. In either case, if the load is in a steady state and the steady state consumption pattern has been identified, subsequent current measurements may not be required.

In some cases, the energy metering system 2 may operate the energy metering mode to measure current through the wires 6 until a steady state load is detected. The controller may then activate energy harvesting mode until a change in the load is detected or a measurement is triggered. For example, a measurement may be triggered through a wireless transmission to the controller or through user input directly to the energy metering system's 2 buttons 20.

In some cases, the controller may detect a change in the load on the wires 6. In some embodiments, the controller may detect a change by monitoring the voltage at the input to the harvest controller or the output of the voltage rectifier. If a voltage change is detected above an event threshold (e.g. a voltage change of 50%) then the controller may activate the energy metering mode to measure the current through the wires 6 until a steady state load is detected.

In some embodiments, the controller may detect a change in the load by monitoring the rate of charge at the harvest controller. When a boost converter is used, pulses are generated at the battery voltage when sufficient energy has been accumulated to engage the charge function of the harvest controller. The pulse rate seen by the battery 8 can be monitored to detect a change in the load on the wires 6.

Energy Metering

In certain embodiments, when the system 2 is powered and in energy harvesting mode, the system 2 can transition to a metering mode in order to measure the primary current(s) on the metered source. In metering mode, the system 2 can collect electrical current information rather than energy. When this transition occurs, the controller within the system 2 can energize components of the analog front end such as amplifiers, filters and the ADC within the controller.

Normally, power and energy measurement and calculation is performed using both current and voltage RMS values present on the metered source. A repercussion of having no electrical connection between the system 2 and the wires 6 can be a necessity to omit voltage measurements. According to certain embodiments of the present invention, assumptions may be made about the electrical system being measured that removes the need to directly measure voltage.

It may be assumed that within target markets, the power systems are relatively stable with respect to time. That is, the voltage supplied to an end user is known and does not deviate significantly from the nominal or expected voltage for a given period of time. In such cases, the system 2 can be configured on the basis that a voltage is indeed present and the measured circuit is closed and passing current. Accordingly, power, energy and other relevant information can be derived without knowing the exact voltage present on the load being measured.

Wireless Link

In certain embodiments, the energy data metered by the system 2 may be accumulated, processed or stored. It then can be sent to a main data concentrator/gateway or an adjacent energy metering system using a wireless transceiver 12. In some embodiments, the wireless transceiver 12 can be a 900 MHz RF transceiver built into the controller. As a skilled reader will appreciate, an appropriate carrier frequency and the wireless front-end can be selected to allow for long range communications, low power consumption and minimal cost. In some cases, the wireless transceiver can be selected to allow future integration with existing smart meter protocols using the same frequency band. It will be appreciated that in other embodiments, various suitable carrier frequencies and wireless front-ends may be used other than those specifically described.

Figure 3A:
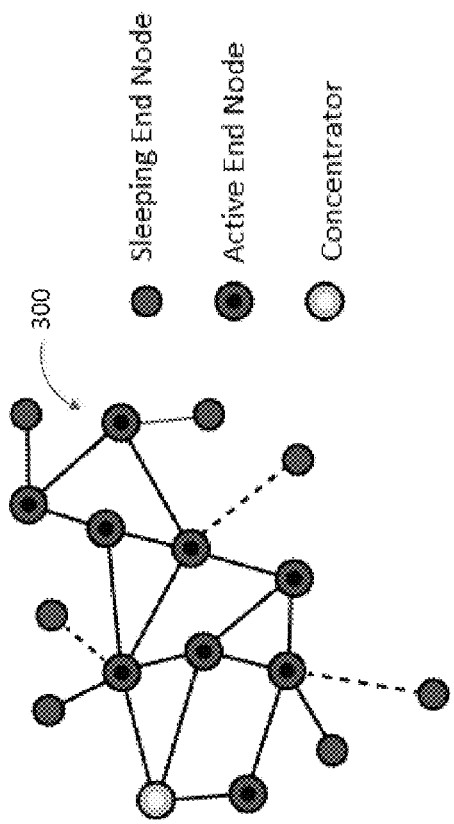
FIG. 3A is a diagram illustrating an example distributed mesh of meters and a concentrator/gateway according to certain embodiments of the present invention.

Referring to FIG. 3A, the wireless link may be organized as a mesh of devices 300. In the mesh of devices, each end node (i.e. each energy metering system) can connect to another end node as a relay point or directly to the data concentrator. At any given moment, there can be any number of active end nodes and sleeping end nodes. The role of active end nodes is to relay information within the network to ultimately culminate at the concentrator. The concentrator may further include additional communication interfaces such as an Ethernet connection to connect to the Internet, for example. This type of wireless network may achieve greater range than a typical point to point network.

In certain operational situations, an energy metering system 2 may operate in sleep or low power mode a majority of the time. 'Waking" a sleeping end node may be necessary to configure that end node or obtain information from that end node or relayed from other end nodes. A sleeping end node may be awakened wirelessly through a controller interrupt and a wake broadcast to the end node's unique address. For example, in some embodiments a sleeping end node may be awakened and transition to the high power mode to service demanding power consumption tasks like RF transmission and calculations.

Figure 3B:
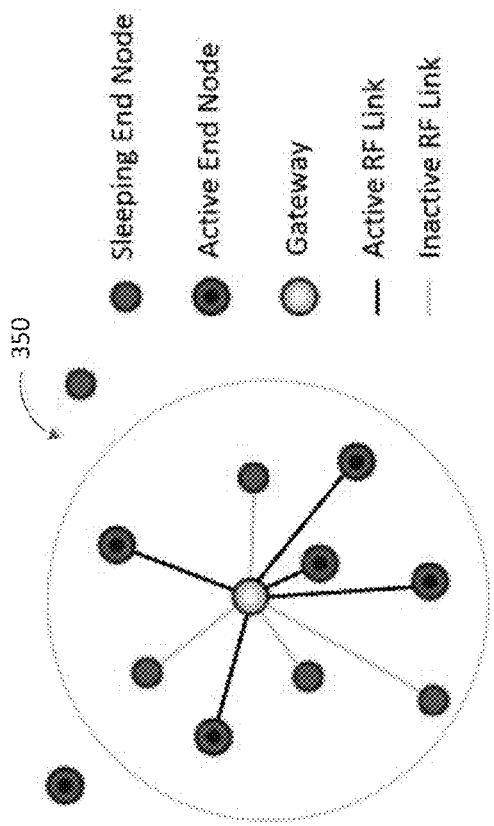
FIG. 3B is a diagram illustrating an example point to point system of meters and a concentrator/gateway according to certain embodiments of the present invention.

Referring to FIG. 3B, in some embodiments a point to point or star wireless network 350 may be employed when a mesh network is unsuitable. Such situations arise when the power requirements of relaying adjacent end node's data via an RF network may be impossible given the energy harvesting characteristics of the utility mains 6. A point to point network generally affords much lower energy consumption from the wireless transceiver as end nodes will only transition from their low power state at pre-defined intervals or when conditions change. Typically a star or point to point network also has lower end node data rate requirements and the RF link can be configured for maximal range instead of the higher throughput typically required for mesh networks.

In certain embodiments of the present invention, pairing the end nodes to the desired network or concentrator is achieved through a time synchronized, user initiated sequence. The concentrator can be commanded to enter into a pairing mode which broadcasts a pair command to all in-range end node meters. The unpaired nodes within range can awaken and respond by displaying "Pair?" or by automatically associating with the concentrator. In some cases, a user can press the "Pair/Unpair" button on the meter/end node to establish a link to the concentrator. If the end node meter is out of the range of a concentrator but within the range of an already paired end node meter, the paired node can serve as a liaison to bridge the pairing process between the unpaired node and the concentrator.

Energy Meter System Hardware

Energy Harvesting Mode

Figure 4:
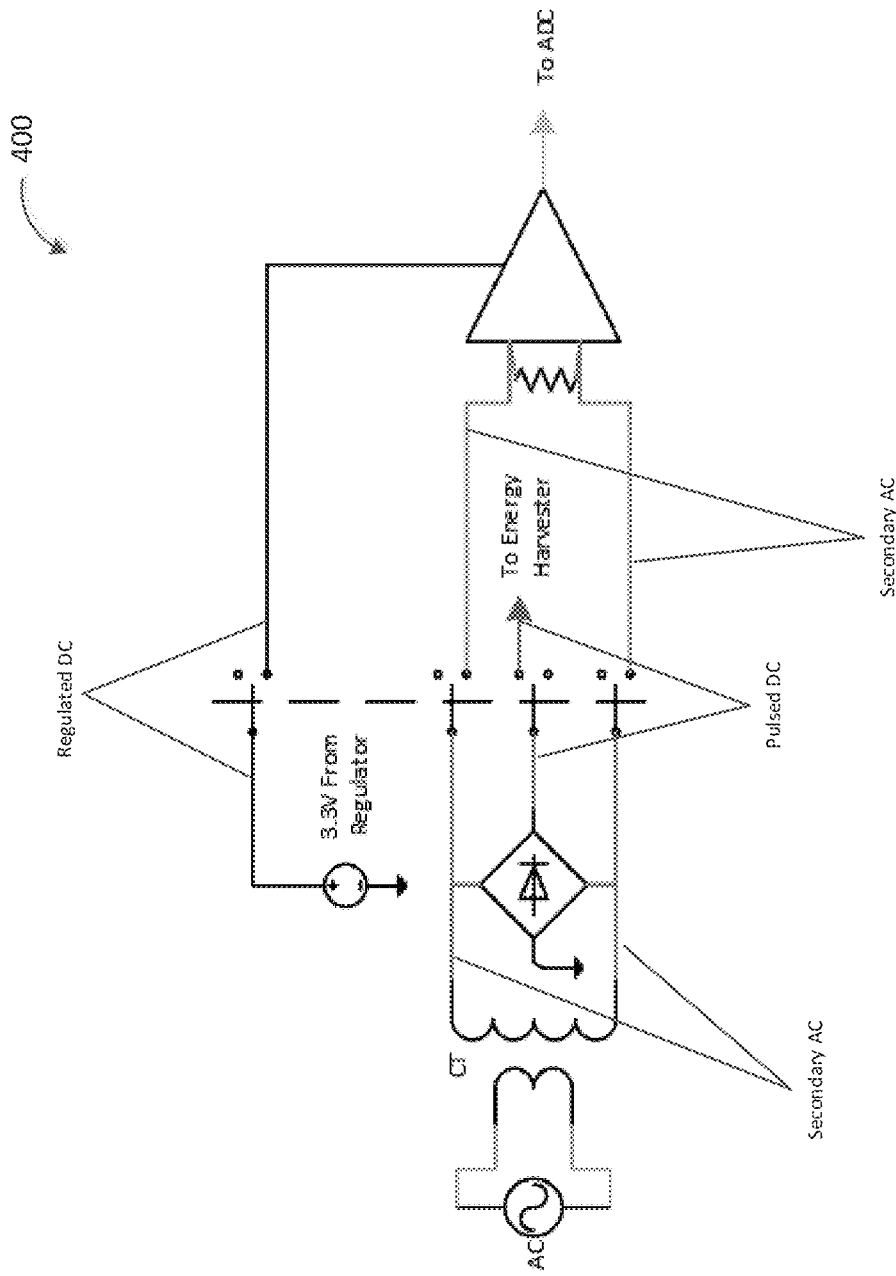
FIG. 4 is a circuit diagram of an example power system for a meter of FIG. 1 when using a CT.

In certain embodiments of the present invention, any of the identical phase circuits within the system 2 can operate as either a power source or an information source. In some cases, power or information capabilities can be accessed per phase, independently of the other phases, at any given time via the dynamic harvest/meter FET switches. FIG. 4 shows an example circuit diagram 400 of a simplified power system responsible for managing this functionality.

Figure 5:
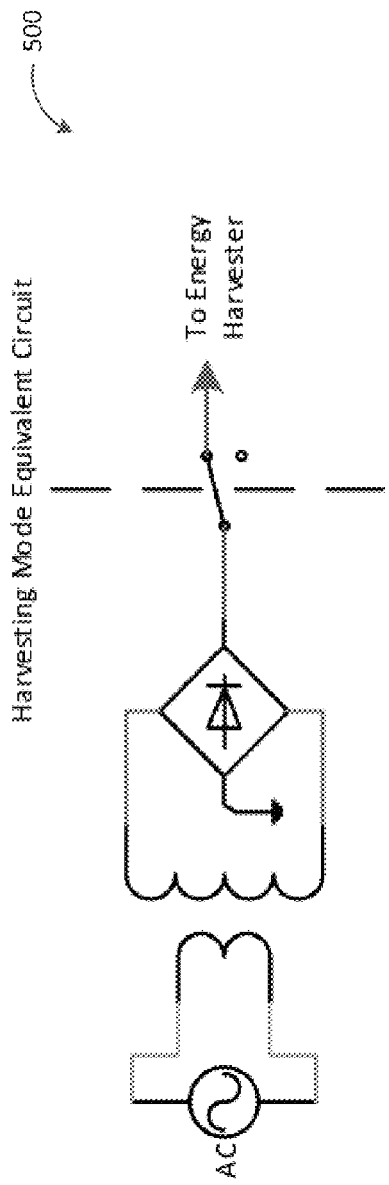
FIG. 5 is an example circuit diagram illustrating the harvesting mode of the meter of FIG. 1 when using a CT.

When the energy harvesting mode is selected or defaulted, FIG. 5 represents an example of the equivalent power path for the CT secondary side. FIG. 5 shows an example circuit diagram 500 illustrating the harvesting mode of the meter.

Figure 6:
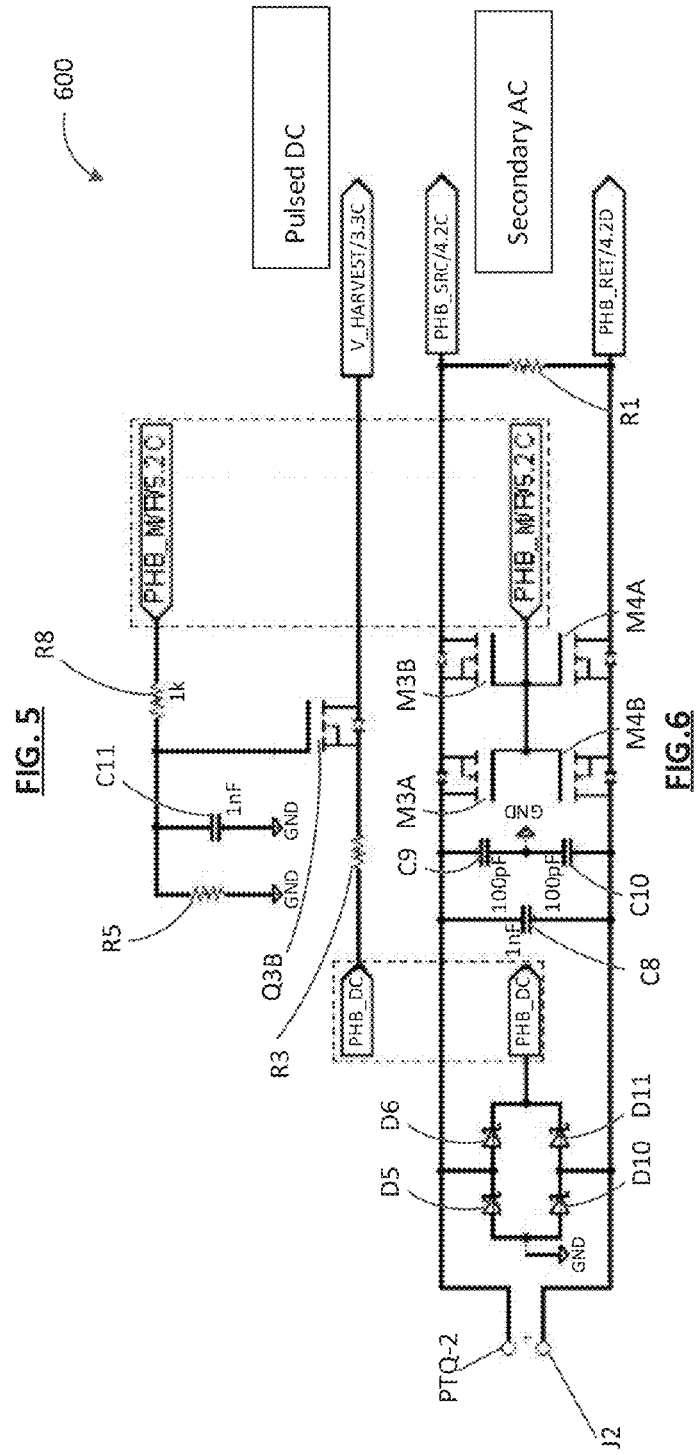
FIG. 6 is a circuit diagram of an example phase "B" Meter/Harvest Block of the meter of FIG. 1.

Referring to FIG. 6, shown therein is an example circuit diagram 600 of a Meter/Harvest Block of the meter. An N-MOSFET bidirectional AC switch formed by M3 and M4 remains "off"/high-impedance when the "PHx_M/H" control line is logic 0 or the controller is inactive. This ensures that energy harvesting mode is the default state. Conversely, the PMOSFET (Q3B) behaves as a normally-on switch when the "PHx_M/H" control line is logic 0 or there is no active controller, creating a low impedance path for current to flow. The condition for current to flow occurs as a result of the common mode voltage applied at the analog front end. This intermediate voltage between the operating voltage of the amplifiers and controller creates the required VDS and VGS levels to bias of the N and P MOSFETs to block or allow current flow.

In the energy harvesting mode when the CT is connected to a primary current, the AC sinusoid of the CT's secondary current can be rectified through low forward voltage drop rectifier diodes (D5, D6, D10 & D11) into pulsed DC. In alternate embodiments, a low threshold voltage MOSFET based semi-active rectifier may be used to reduce the forward drop losses associated with diode bridge rectifiers. This alternate embodiment may benefit from lower forward voltage drop or energy dissipation as well as much better conductance once operating in the forward bias region. A single reverse blocking diode (preferably low forward voltage Schottky) can be used at the output of this type of rectifier. The pulsed DC can then passed by the normally-on/low impedance PMOSFET (Q3B) to the energy harvester controller power input. The use of a very weak pull-down R5 (1M) can ensure the normally-on behavior of the P-MOSFET even when the controller is inactive or uncontrolled. Gate stability may be further improved with a small decoupling capacitor (C11) in parallel with R8. The decoupling capacitor limits current lash from gate charge sourcing and sinking of the controller IO during level transitions. R8 may additionally decouple and stabilize the FET's gate voltage.

The gate voltage and drain-source voltage must be sufficiently large (greater than the cutoff voltage of the FET) to pass current from the rectifiers to the harvesting controller. In other embodiments, a P-FET can be removed and the rectifier outputs connected to the harvesting controller directly. This eliminates any power dissipation and losses that may be present on the P-FET and allows for "bias-less" operation. Without a P-FET in-line with the harvesting controller input, the VDS (which normally must be greater than 1V for a low threshold FET) can be ignored thus allowing for a greater energy harvesting input range. In other embodiments, this circuit topology may allow for much lower voltage harvesting when other meter/harvest input sources which deliver lower output voltages are used.

Metering Mode

To digitize the secondary current of the CT, the controller can set "PHx_M/H" to a logic "1" and provide a voltage to the gates of M3 and M4. This results in the impedance between the CT secondary input and the burden resistor R1 being low ($2 \times RDS_{ON}$ of the MOSFET). Conversely, the pulsed DC power switch P-MOSFET, Q3B becomes high impedance between the rectified output of the diodes and the energy harvester controller power input. The $RDS_{ON}$ compared to the burden resistance can be at least an order of magnitude lower in value to minimize SNR losses and gain error. Additionally, the AC switch comprising of two N-FETS per leg can share the same package and therefore the same silicon die. This minimizes the variance in component performance and the induced resultant errors in measurement.

Figure 7:
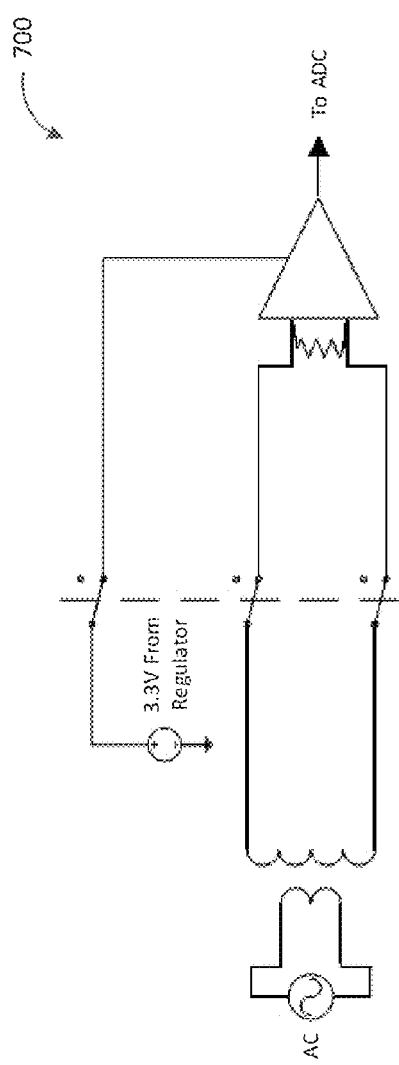
FIG. 7 is a circuit diagram of an example metering mode equivalent circuit of the meter of FIG. 1 and FIG. 6.

The low impedance current path formed between the CT secondary and the burden allows AC current to flow directly to the burden resistor (and bypass the rectifiers and harvester controller) since the resultant voltage produced by the secondary current and the burden can be much less than the forward conduction voltage of the diode. An example metering mode equivalent circuit 700 is shown in FIG. 7.

Meter/Harvest Power Switch

Figure 8:
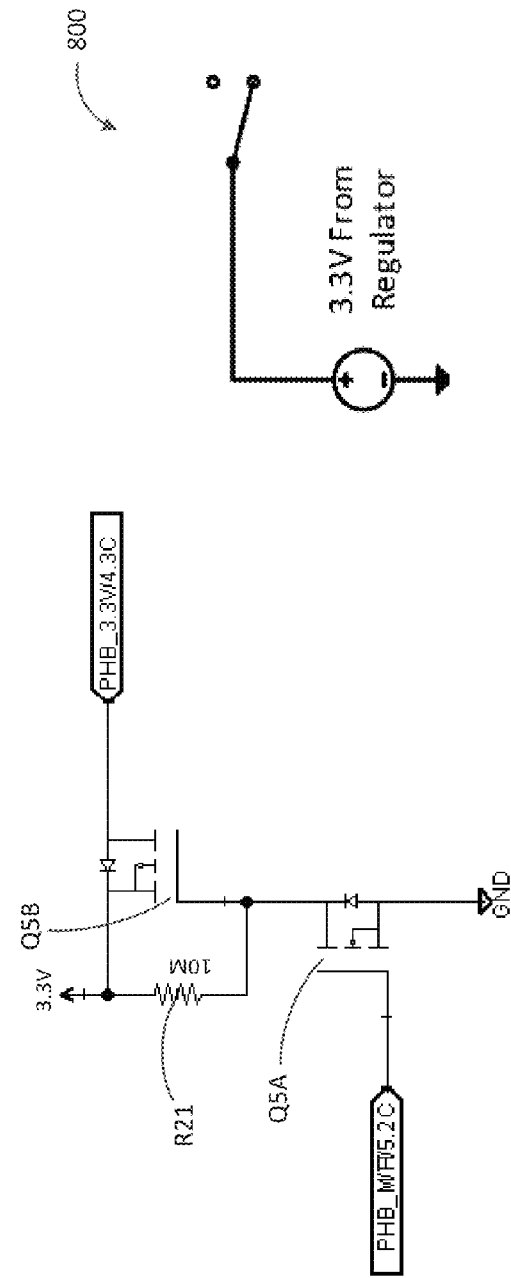
FIG. 8 is a circuit diagram of an example meter/harvest power switch of the meter of FIG. 1.

Referring to FIG. 8, shown therein is an example a circuit diagram 800 of a meter/harvest power switch. In some embodiments, to minimize the quiescent power consumption when metering is not required a dynamic power switch using an N-P MOSFET pair can be employed to realize a "zero" power normally open switch. When the controller requires functionality from the metering hardware, a logic "1" can be asserted to the gate of Q5A. This enables the N-MOSFET and in turn provides a ~0V reference to the gate of Q5B thus allowing it to conduct as well. Once Q5B is biased by the Q5A, DC current at 3.3V can be provided to downstream hardware like amplifiers and the voltage reference.

A 10M pull-up may ensure the default state of the power switch even if the controller is unpowered or in noisy conditions. The worst case pull-up current of this configuration is 3.3V/10M=330 nA when engaged and ~5 pA when uncontrolled/disengaged since the bulk of the current is blocked by Q5A which is in cutoff.

Harvesting Controller

In certain embodiments of the present invention, the system 2 can include a harvesting controller which may serve multiple purposes. An example of a suitable controller is the P/N: MAX17710 manufactured by Maxim Integrated or the Texas Instruments bq25507.

Boost Conversion of Source Energy

Figure 9:
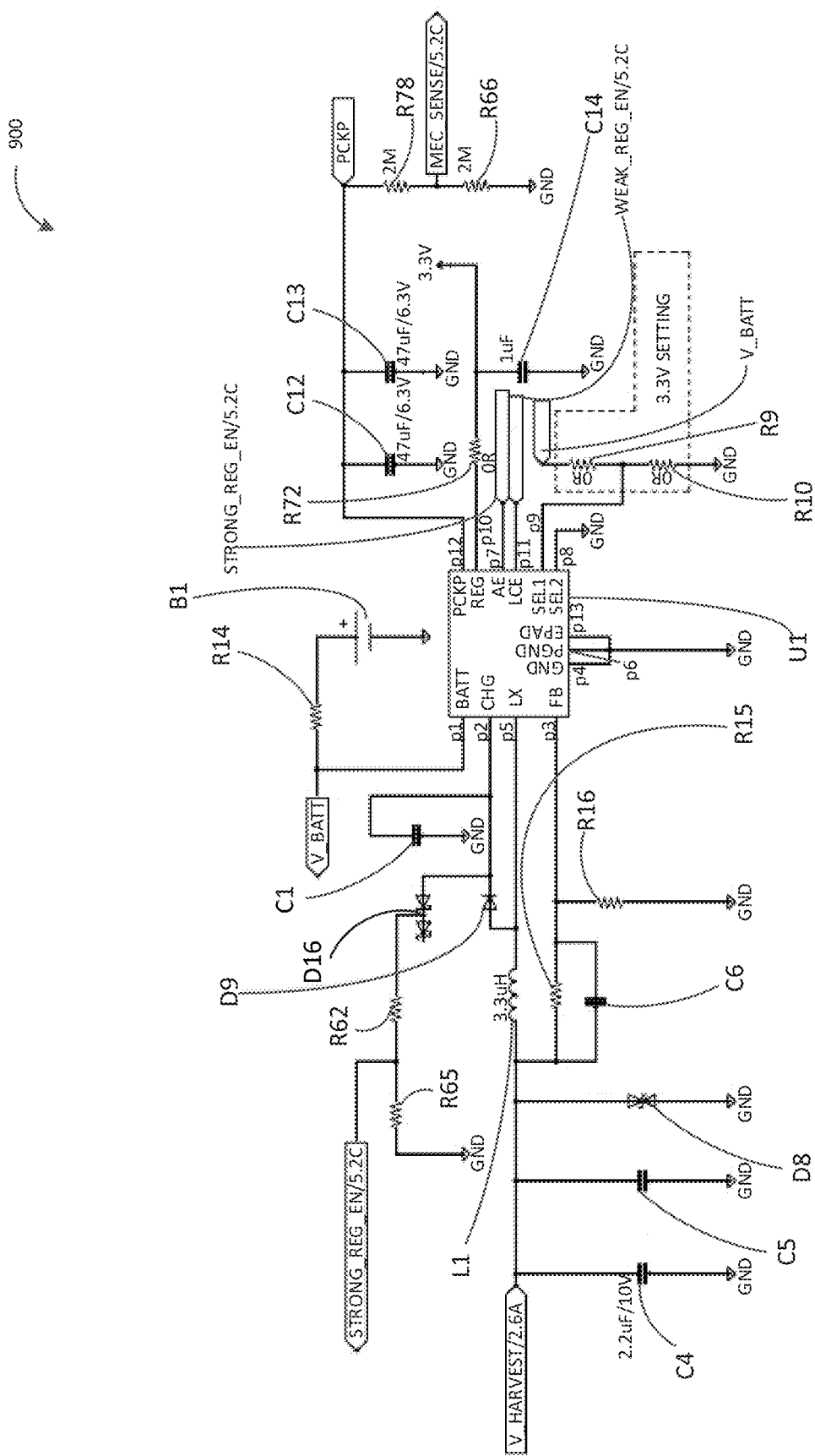
FIG. 9 is a circuit diagram of an example energy harvesting controller of the meter of FIG. 1.

Referring to FIG. 9, shown therein is an example circuit diagram 900 of an energy harvesting controller. In certain embodiments, when the system 2 operates in energy harvesting mode, the harvesting controller can perform voltage boost conversion to the input power derived from the pulsed/rectified DC. Boosting the voltage may be required where the voltage level from the pulsed DC is too low and unregulated to charge the battery 8 directly. Additionally, the harvest controller may be responsible for maintaining the full-charge battery voltage at less than the recharge max voltage (e.g. 4.15V) such that damage to the battery 8 does not occur.

In certain embodiments of the present invention, the system 2 can use conventional processes for boost conversion. In an example embodiment, the charging components can be chosen to boost secondary currents of:

$$50\ \mu A \geq I_{SEC} \geq 30\ mA\text{(AC or DC)}$$

which corresponds to a primary RMS AC current of:

$$0.15\ A \geq I_{SEC} \geq 21.2\ A\text{(per phase) with a YUANXING}$$
$$P/N\text{: CTSA-10 (1:3000)}$$

The boost converter can comprise a bulk, low ESR MLCC storage capacitor (C4), an inductor (L1) and a Schottky (fast) diode (D9). A skilled reader will appreciate that these components can be selected appropriately for the power source, for example to optimize boost converter efficiency.

To improve the efficiency of the boost converter, various feedback and power tracking schemes e.g. MPPT can be employed. In one such embodiment, the feedback pin (3) of U1 can include a voltage divider which sets the maximal voltage (~2V) on the V_Harvest net to allow for charge "buildup" on C4 before engaging the boost conversion. This method can generally be applied even with low primary CT currents since the behavior of the CT secondary can be modeled as a current source which essentially "pumps" in charge into C4. The voltage accumulated by the bulk capacitor can be a maximum at 2V and can have an energy equal to $$\tfrac{1}{2}C_{TOT}*V_{CAP}^2 = 0.5*2.3\ \mu F*2^2 = 4.6\ \mu J$$

A skilled reader will appreciate that the feedback and power tracking systems can be optimized dynamically or in a fixed fashion depending on the application or source types.

Battery Charger

In some embodiments, the battery 8 can be a solid state, rechargeable lithium-ion cell. An example of such a battery is an 85 mAh, high energy density, low self-discharge, high cycle lithium-based thin cell produced by Tadiran Batteries. This battery can be used as the storage medium for the system 2 in some embodiments. The cell voltage can range from ~2.8V to ~4.15V depending on charge state or load. The overall energy stored within the cell when fully charged is roughly 1,200 J. A lithium-ion cell battery may be beneficial for operation with intermittent loads and longer periods without loads due to the lower self-discharge of the battery when operating in a hibernation mode.

In some embodiments, the battery 8 may be augmented to work in parallel with low ESR multi-layer capacitors which can reduce the impedance "seen" by the downstream loads like the RF transceiver, analog front end and controller. As the battery 8 ages or is exposed to conditions that affect the performance, capacitors can also help maintain the apparent impedance of the downstream loads.

Voltage Regulators

In certain embodiments, the system 2 may use an integrated or external voltage regulator that is responsible for generating a regulated source of power for the controller, communication systems and analog sections. Voltage selection can be achieved through a SEL1 and SEL2 pins which may be left floating to achieve a desired output (e.g. 3.3V). The voltage regulator may have a high power and lower power regulation mode. For example, a high power regulation mode may have a maximum current draw of 400 mA while the low power regulation mode has a maximum current draw of 50 µA. These two modes can be selectable via the regulator enable pins on U1 (pins 7 & 11) either by the controller or by a resistive divider auto-enable feature.

Hibernate Mode/Unpowered

Figure 2:
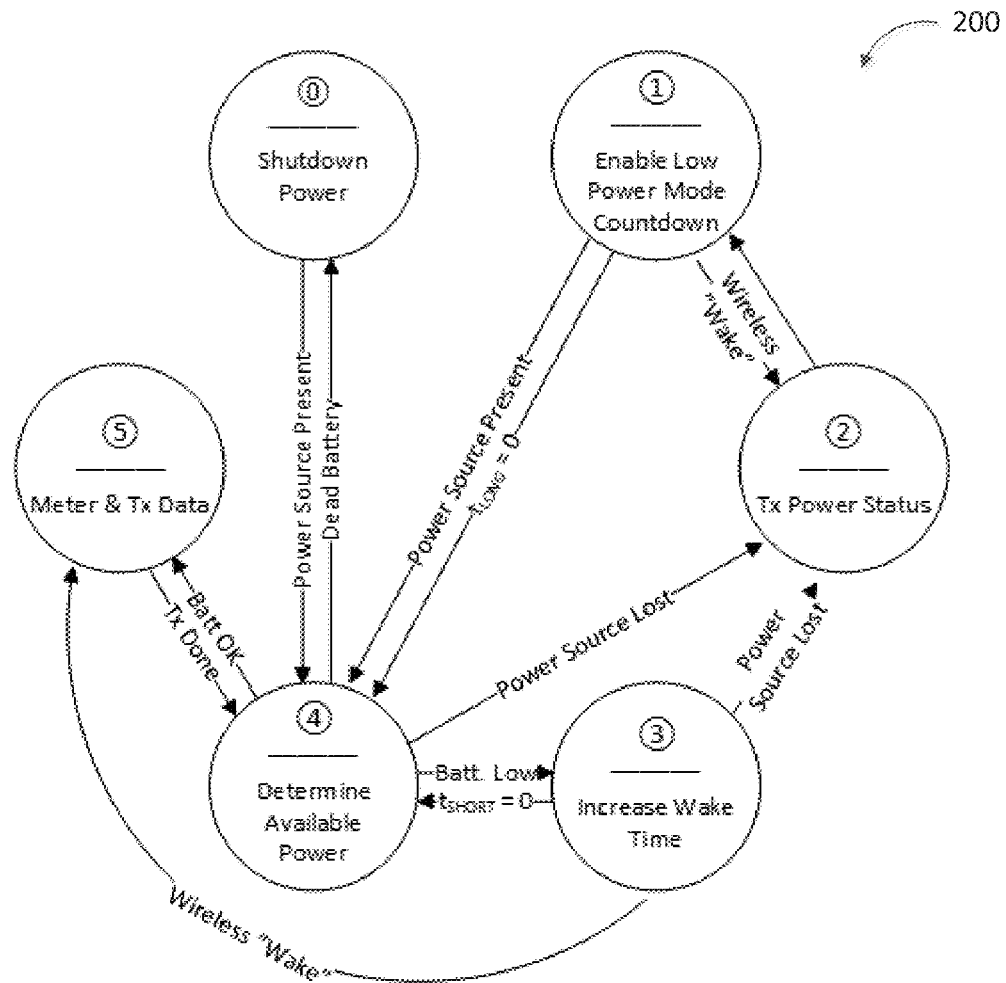
FIG. 2 is a diagram illustrating example hardware states and state transition condition of the meter of FIG. 1.

In certain embodiments of the present invention, the system 2 may operate in a hibernation mode. A hibernation mode can be defined by the system 2 controllers and regulators being completely unpowered. This situation can be caused by: a factory ship; when the meter determines there is insufficient power to remain in sleep or active mode; or when the energy harvester detects that the battery's under voltage threshold for cutoff was violated. As mentioned above, the energy meter system 2 can be configured to default current to the energy harvesting circuit in the absence of active control until such time as the system is capable of exiting hibernation mode. In certain embodiments, the controller can enter this mode from an active or sleep state at a given time or based on an identified set of conditions which dictate this response. An example of state transitions is shown by state transition diagram 200 in FIG. 2.

Figure 18:
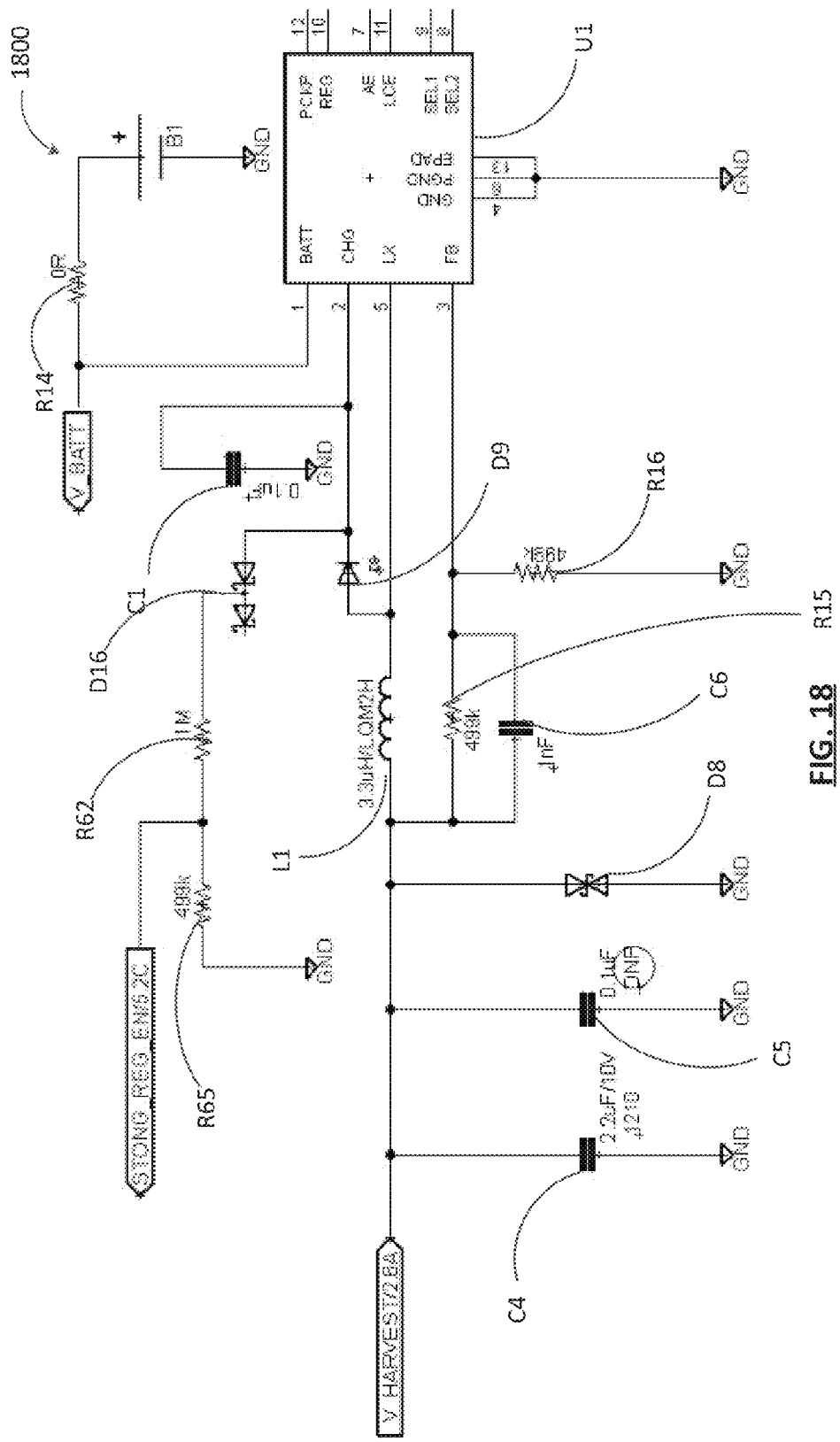
FIG. 18 is a circuit diagram of an example energy harvesting controller, protection diode and enable signals.

Referring to FIG. 18, shown therein is an example circuit diagram 1800 of an example energy harvesting controller, protection diode and enable signals. In certain embodiments of the present invention, when the system 2 is harvesting and there is no regulated output the charge pin of the harvest controller (pin 2 of U1) can be pulsed with boosted voltages. The boost pulses can be sent through a reverse blocking diode (D16) and a resistive divider (R62 & R65) to create a pulsed enable for the high power regulator enable input. The enable voltage can be calculated using the $VAE_{th}$ ("strong regulator" turn-on threshold voltage) to ensure a non-empty battery state before powering the meter. This can be done to prevent the meter going into a brownout loop where the regulator is enabled but there is insufficient power within the battery or the power source to sustain operation. Essentially, this circuit can ensure that the battery has a small reserve of energy for wireless communications, metering, calculations or simply booting up before enabling the regulator. For example, where:

$$VAE_{th} = 1.13V\text{(min)}$$

And:

$V_{CHG} \sim = V_{BATT}$ since the battery has a relatively low internal series resistance Then, to ensure regulator operation:

$$VAE_{th} >= 1.2V(V_{BATT} - V_{Diode})*\text{Ratio}$$

Solving for Ratio with $V_{BATT}$ @~25% reserve on the state of charge (SOC):

$$1.2V = (3.8V - 0.25V)*\text{Ratio} \rightarrow 0.338 \sim = \tfrac{1}{3}$$

In certain embodiments of the present invention, to ensure minimal and required pin current, the system 2 can include an approximate serial resistance of 1.5 MΩ:

$R_{TOP}$=1 MΩ, $R_{BOT}$=499 kΩ→Ratio=$R_{BOT}/(R_{TOP}+R_{BOT})$=0.333

In certain embodiments of the present invention, a minimum battery state of charge (SOC) of ~25% can be selected to ensure cyclic brownouts will not occur. Where this voltage is ~3.8V, therefore:

$V_{AE(actual)}$=0.333*(3.8V−0.25V)=1.18V>1.13V

The above calculations do not consider the battery's internal resistance (which is somewhat variable depending on age) and can affect the enable level arriving at the regulator enable input. A skilled reader will appreciate that the enable voltage can be selected for different minimum battery states of charge as desired.

In other embodiments, resistive dividers can be configured to set thresholds for the operational ranges for hibernate, pre-charge, minimal operation and full operation system states for the voltage regulator(s) and battery.

Active Mode/High Power

In certain embodiments of the present invention, after the high power regulator has been enabled, the system 2's consumption at 3.3V can be as much as 400 mA. This regulation may be required for power demanding operations such as enabling the analog front end and ADC, transmitting/receiving wireless data, performing complicated and time critical calculations at higher clock frequencies and so on. Additionally, this state can also add to the overall quiescent current draw from the battery where the high power regulator can be less efficient.

Sleep Mode/Low Power

In certain embodiments of the present invention, a low power regulator can be used where the controller is operating minimally or in a low power mode. In some embodiments, when the system 2 is operating in a low power mode, the maximum current draw from the battery cannot exceed a sleep mode maximum current, such as 50 µA for example. This maximum current may be set to prevent degrading regulation and compromising the system's integrity. The quiescent current draw from the regulator itself may also drop as much as 5× since the regulator may be more efficient in the low power mode. Transitions between regulator active mode and sleep mode can be controlled by the controller, for example in U1 using pin 7 to enable high power mode and pin 11 to enable low power mode.

In other embodiments, a low power or sleep state regulator may be eliminated in favor of directly powering the controller from the harvest source. In such an embodiment, the quiescent draw from a low power regulator is eliminated and the controller operation does not suffer. When the system is required to exit the low power or sleep state, the controller may dynamically enable the high power regulator that is required for active operations.

Analog Front End ("AFE")

Figure 10:
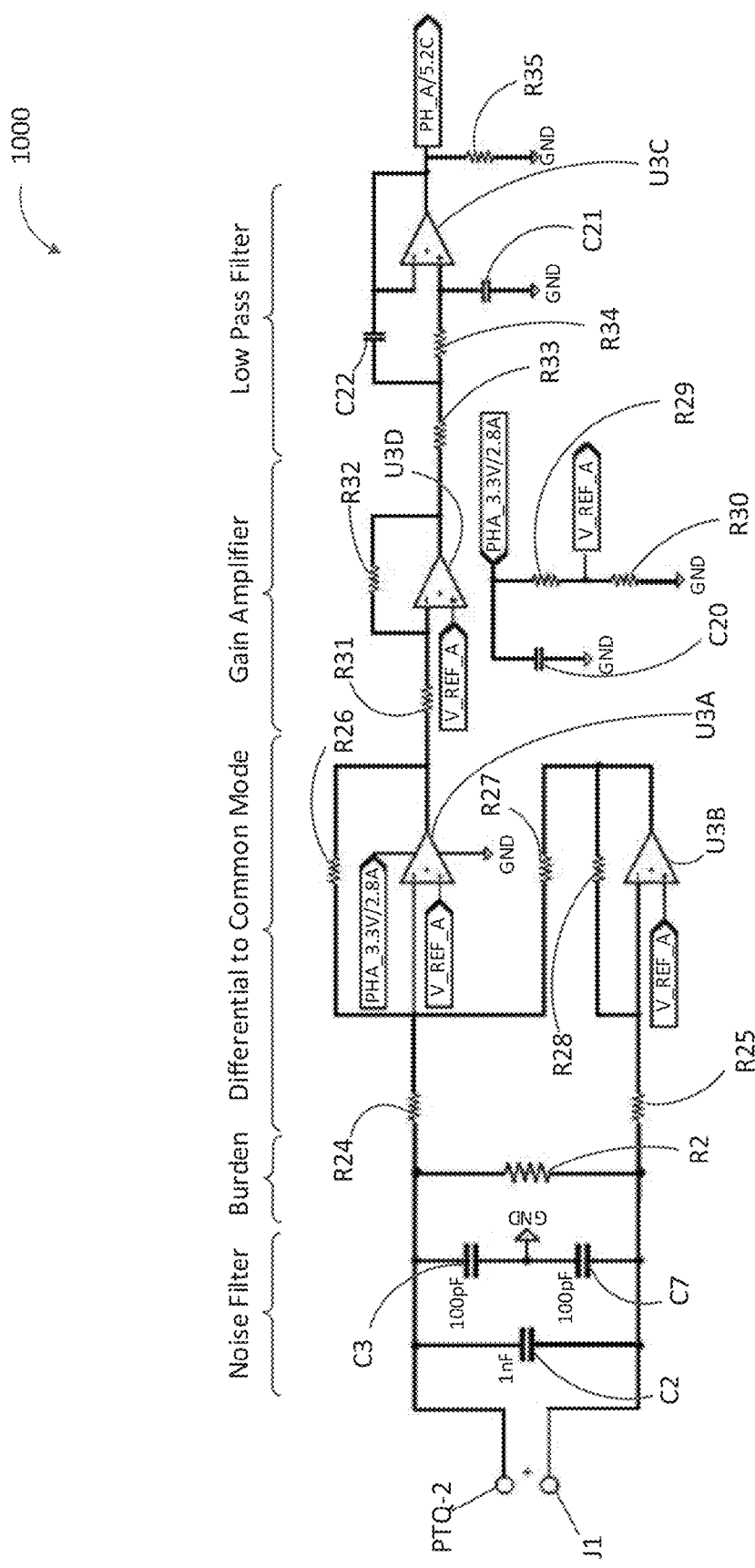
FIG. 10 is a circuit diagram of an example analog signal path for the meter of FIG. 1.

In certain embodiments of the present invention, the system 2 includes an AFE. The AFE may comprise five stages, each responsible for relaying a bounded, band-limited and properly referenced analog signal to the controller's ADC. In some embodiments, the AFE may only be active when the system 2 is in a metering mode. Examples of the AFE stages are described below in order from the signal output at the secondary of the CT to the ADC input. FIG. 10 shows the entire equivalent analog signal path 1000 according to an embodiment of the present invention.

In some embodiments, the various components of the AFE may each include a power switch. The power switch may allow the components to be activated and deactivated independently. In embodiments where the meter includes multiple connections, the power switches may provide control for the AFE associated with each power connection.

Noise Filter/Protection

Figure 11:
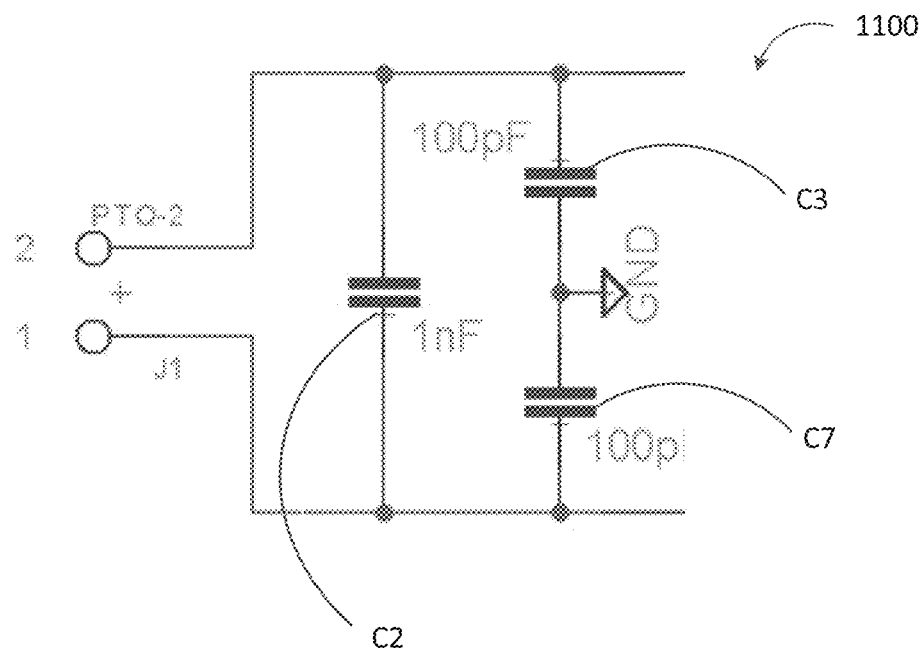
FIG. 11 is a circuit diagram of an example equivalent noise suppression and protection circuit of the meter of FIG. 1.

Referring to FIG. 11, in certain embodiments of the present invention an equivalent noise suppression circuit 1100 can be implemented to differentially and "commonly" (with respect to a local ground) suppress "high" frequency noise. This can have a twofold effect on the downstream circuits:

(i) Protection: the circuits and elements downstream may be exposed to transients from the CT innate coupling of the AC load line. The noise filter can be implemented to suppress surges (lightening, switching inductive components, etc.), electric fast transient or EFT (non-linear power supplies, motor variable speed drives, etc.).

(ii) Passive low pass filter (LPF) or anti-aliasing filter. The capacitors' impedance is a function of input frequency. Transients, noise and high frequency components are coupled to ground (common mode) or the other terminal (differential) proportionally to the frequency and capacitance.

The circuit can implemented as a "rule of thumb" and allows a skilled reader to make modifications if required without PCB modifications.

In other embodiments, the input stage may have a differential, common or both TVS (Transient voltage suppressor), MOV (Metal Oxide Suppressor) and/or an in-line fuse. A skilled reader will understand the importance of protection and the techniques therein.

Burden Resistor

Figure 12:
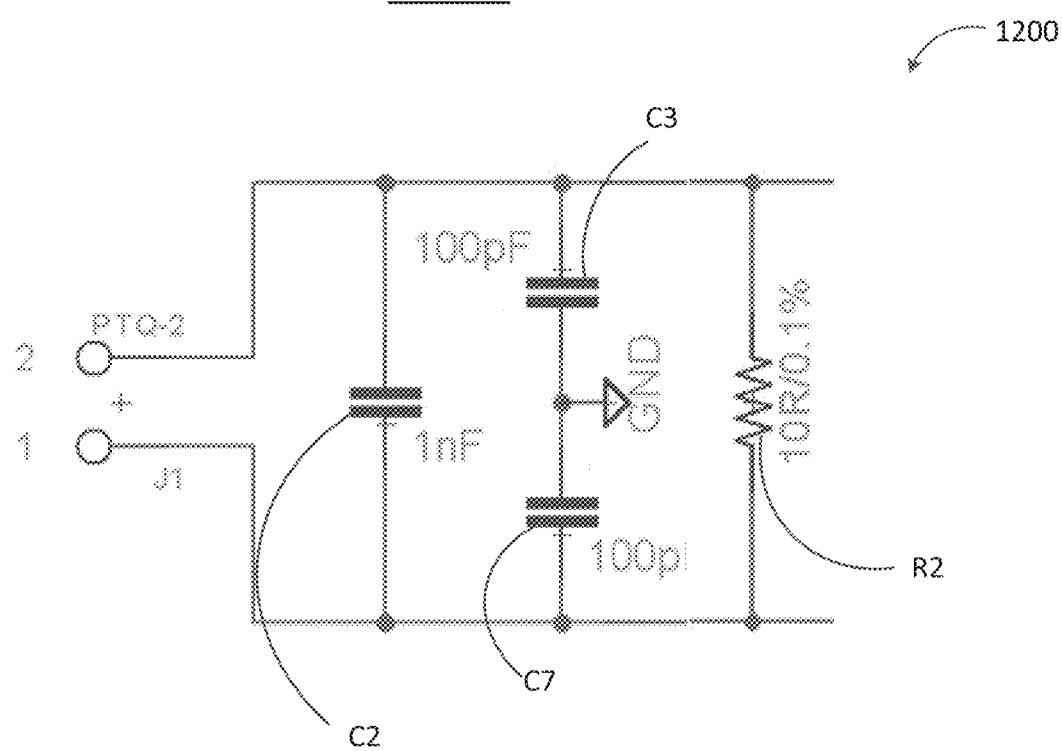
FIG. 12 is a circuit diagram of an example equivalent noise filter and burden circuit of the meter of FIG. 7.

Referring to FIG. 12, in certain embodiments of the present invention, the CT secondary can be considered as a non-ideal AC current source. As such, the current from the CT can be "transformed" into a potential so that the downstream components can condition and transfer the analog information to the ADC.

The voltage transformation can be described below with regard to the example noise filter and burden circuit diagram 1200 shown in FIG. 12. Based on Ohm's Law, the voltage across the burden is a function of the current through it. Working with phase-less RMS AC currents to simplify:

$V_{BURDEN}=I_{BURDEN}\times R_{BURDEN}$

In some embodiments, the meter's range for primary AC current may be 0-30 A peak or 0-~21.2 A RMS. When using a CT with a turns ratio of 1:3000:

$I_{BURDEN}(MAX)$=30 $A_{pk}$×(1 turn)/(3000 turns)=10 $mA_{pk}$

This current translates to a voltage of:

$V_{BURDEN}(MAX)$=0.01 $A_{pk}$×10Ω=100 $mV_{pk}$

Therefore the effective, un-amplified voltage range applied to the next stage of the AFE being provided by the CT secondary—burden combination is:

0V≤$V_{BURDEN}$≤100 mV

CT type (ratio) and burden type are selectable for different applications where more or less primary current is to be metered. The burden voltage conversion can still remain bounded between 0 and 100 mV if desired. In some instances the burden voltage conversion may be adjusted as needed, and it will be apparent to a skilled reader based on the foregoing how to select the appropriate CT and burden type for the desired implementation.

Differential to Common-Mode

Figure 13:
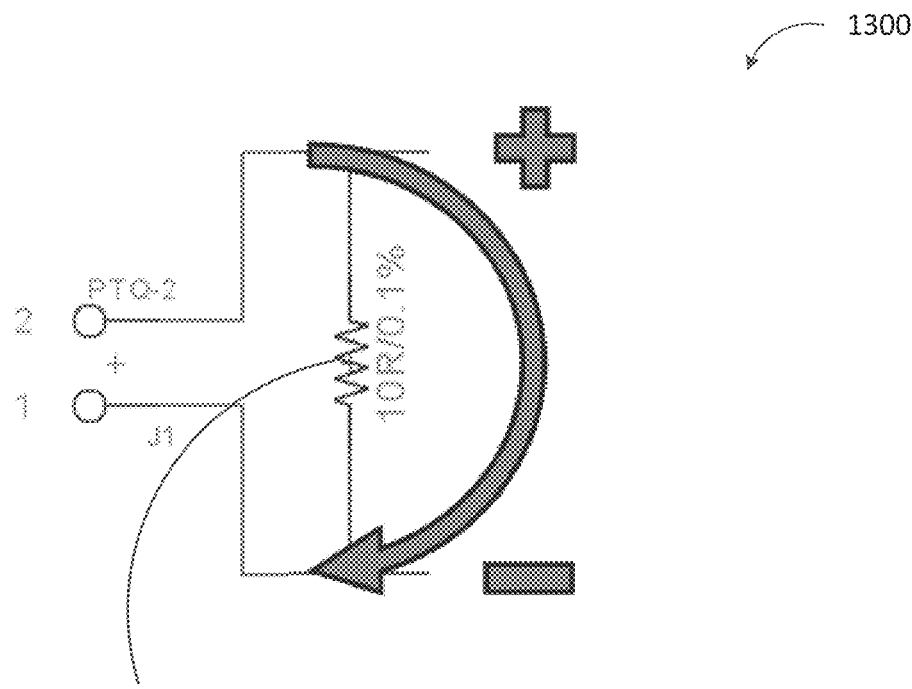
FIG. 13 is a circuit diagram of current flowing clockwise through the meter's burden resistor of FIG. 12.
Figure 14:
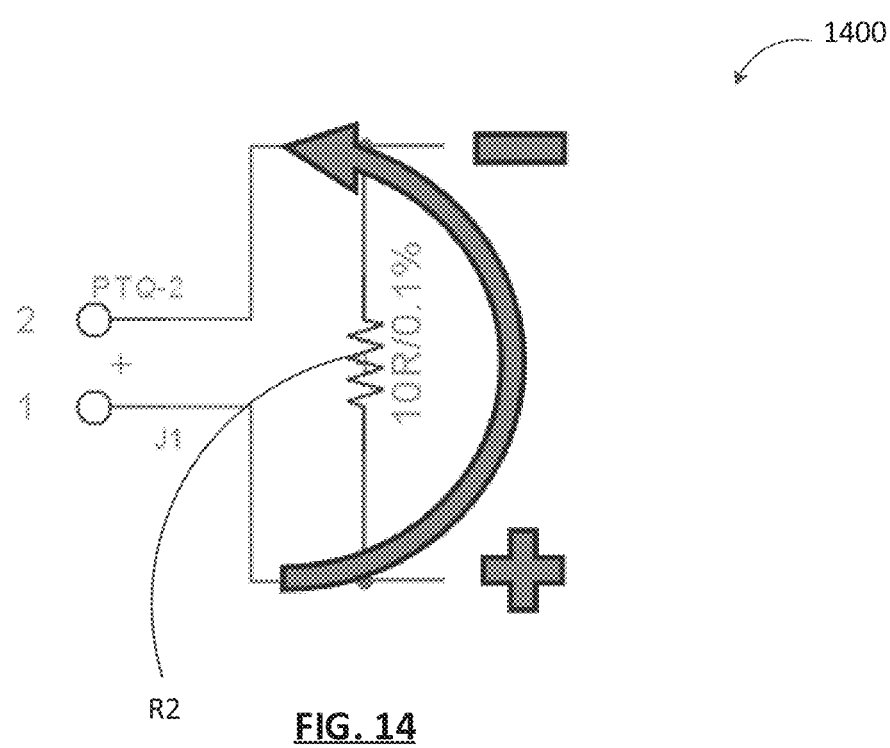
FIG. 14 is a circuit diagram of current flowing counter-clockwise through the meter's burden resistor of FIG. 12.

FIG. 12 shows an AC burden connected to the secondary side of a CT and follows the typical operation of a two amplifier version of an instrumentation amplifier. In embodiments using the CTSA 10, when current is flowing through the sinusoidal AC load line being measured the burden has roughly 3000× less AC current flowing. The current at any instant may be flowing clockwise (see the example current flow circuit diagram 1300 shown in FIG. 13) or counter clockwise (see the example current flow circuit diagram 1400 shown in FIG. 14) within the circuit. Current will be clockwise in the positive portion of the AC sinusoid and counter clockwise in the negative portion. As a result the voltage across the burden may be constantly alternating its polarity.

Figure 15:
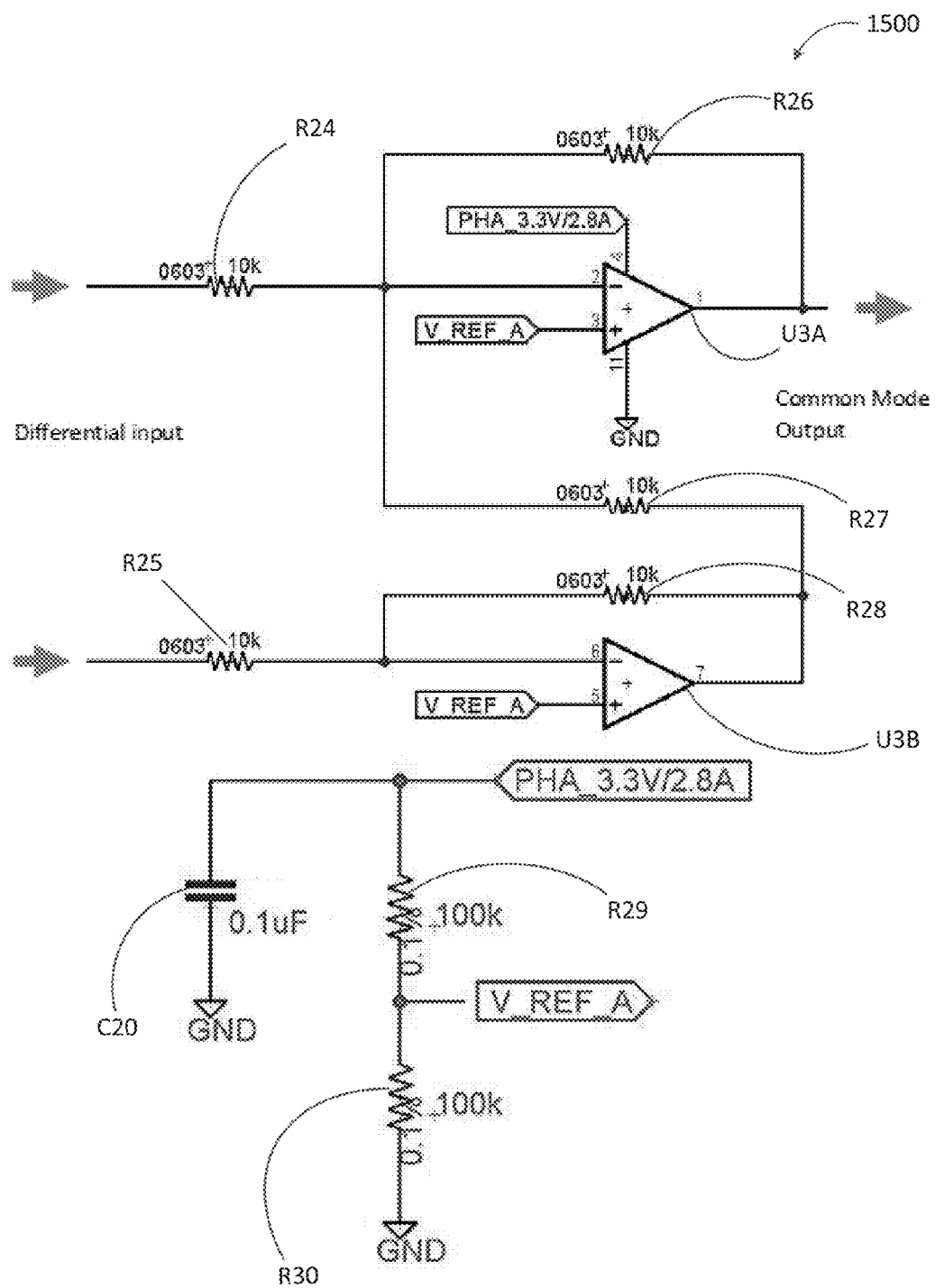
FIG. 15 is a circuit diagram of an example common mode transformation circuit and voltage reference circuit in the meter of FIG. 1.

In some embodiments, the gain amplifier, anti-aliasing filter and the ADC may require a ground referred analog signal. In such cases, a differential, non-referred AC signal generated at the burden resistor can be translated into a common mode or ground referenced AC signal. The circuits depicted in FIG. 15 are an example of a voltage bias circuit 1500 providing a differential to common mode transformation:

(i) the differential to common mode signal transformation circuit can include a precision voltage reference (R29 & R30) and two voltage follower or buffers (U3A & U3B) linked via a "connecting" resistor (R27).

The voltage reference can apply a DC offset to an AC sinusoid to shift the signal such that its average resides at $\frac{1}{2}V_{REF}$. This approach can be used where the ADC is a common mode device that must reside between $V_{REF}$ and 0V. The reference voltage can be the control voltage itself or comprised of a simple, low power resistive divider between VCC ground or 0V. In an example embodiment it can operate as follows:

$$V_{REF}=VCC \times (R_A/(R_A+R_B))=3.3V \times (100 \text{ k}\Omega/(100 \text{ k}\Omega+100 \text{ k}\Omega))=1.65V$$

$$P_{DIV}=(V_{DIV}^2)/R_{TOT}=3.3V/200 \text{ k}\Omega=54.4 \text{ }\mu W$$

The two buffers can be used for two functions. The buffers (unity gain amplifiers) can eliminate any difference at the inputs through negative feedback. Essentially, the output matches the input ($V_{REF}+V_{BURDEN}$ as "seen" from U3B to U3A). The "connecting" resistor creates a reference path between U3A and U3B for the burden's differential voltage. Therefore, any voltage difference developed between the inputs is shifted up to 1.65V or ½VCC and referred to ground at the output of U3A.

Gain Amplifier

Figure 16:
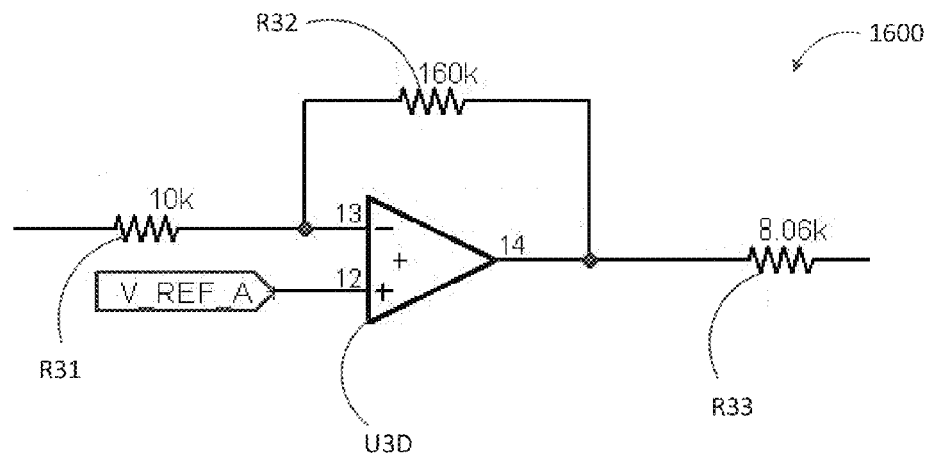
FIG. 16 is a circuit diagram of an example inverting gain stage amplifier of the meter of FIG. 10.

Referring to FIG. 16, in certain embodiments of the present invention a gain stage amplifier 1600 can be configured to:

(i) ensure the maximum signal to noise ratio at the input of the ADC; and
(ii) condition the voltage range of the burden-diff/common output to match the maximum dynamic range of the ADC input.

In certain embodiments of the present invention, the ADC reference voltage may be VCC, for example 3.3V. In such cases, the voltage range of the input must also reside within the bounds of 0V to 3.3V to be digitized properly. Assuming the output voltage of the burden stage is 0-100 mV, a gain is required to utilize the ADC's dynamic input voltage range.

In this example embodiment, the required gain can be calculated as follows:

$$V_{ADC(MAX)}=VCC=3.3V,$$
$$V_{REF}=1.65V \rightarrow \text{yields} \rightarrow V_{RANGE}=\pm 1.65V$$

$$A=V_{RANGE}/V_{IN(MAX)}=1.65V/100 \text{ mV}=16.5=24.3 \text{ dB}$$

In certain embodiments of the present invention, an arbitrary voltage gain of 16× or 24 dB can be used to simplify firmware calculation since 16 is a bit shift operation of 4 to the "left". Additionally, a slightly reduced gain allows for a small margin of overcurrent or transient situations.

In certain embodiments of the present invention, the amplifier can be a traditional inverting, negative feedback amplifier. The effect of inversion is a phase reversal which has no bearing on the amplitude:

$$V_{in}/V_{out}=|-R_{32}/R_{31}|=|-160 \text{ k}\Omega/10 \text{ k}\Omega|=|-16|$$

$$A=V_{RANGE}/V_{IN(MAX)}=1.65V/100 \text{ mV}=1.65=24.3 \text{ dB}$$

In some embodiments, alternative gain stage amplifiers may be used with different configurations if different gain or ADC input parameters are desired.

Anti-Aliasing Filter

Figure 17:
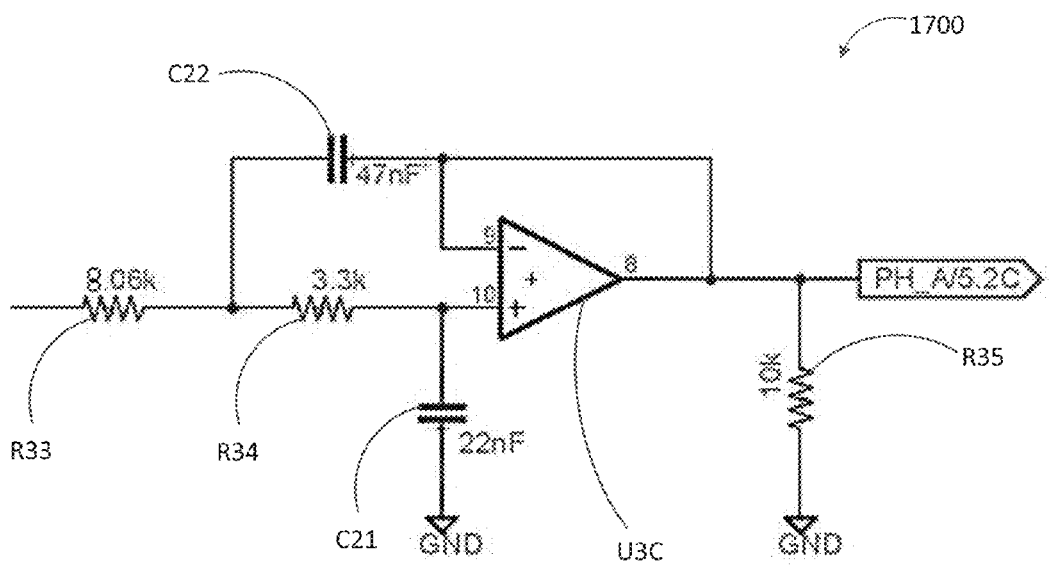
FIG. 17 is a circuit diagram of an example anti-aliasing filter of the meter of FIG. 10.

Referring to FIG. 17, in certain embodiments of the present invention, an anti-aliasing filter or low pass filter 1700 can be used to band limit the incoming signal to the ADC. Noise, fundamental harmonics and the Nyquist rate define the maximum, non-aliased frequency discernible by a discrete rate sampling system as a function of the sampling rate ($f_s$):

$$f_{MAX} \leq f_s/2$$

In certain embodiments of the present invention, the primary AC loads can have a variety of consumption bandwidths (i.e. active power supplies). This can result in waveforms that have higher bandwidths than the 50 or 60 Hz nominal frequencies. To ensure that these higher frequency components can be metered the sampling rate can be selected to be much greater than the nominal frequencies but not so great as to include un-informative components.

In some embodiments, the sampling rate can be selected to be from 8 to 128 samples per cycle or 480 Hz to 7,680 Hz. In these embodiments, an 8 sample/cycle sampling rate means that the meter can accurately measure up to the 8th harmonic within a 60 Hz system. Since the nominal frequency of the system may vary between and within 50 and 60 Hz, a frequency tracking software algorithm can be employed. A skilled reader will appreciate that alternative sampling rates may be selected depending on the desired operating parameters.

In certain embodiments of the present invention, the anti-aliasing filter is designed such that the pass band region of the amplifier has unity gain and the cutoff frequency $f_c$ (−3 dB point) begins at 480 Hz to ensure that higher frequency components will not be aliased back to the pass band ($\leq f_s/2$). In some cases the filter can use an active, second order Sallen-Key topology. A skilled reader will appreciate that alternative low pass filter cutoff frequencies may be selected depending on the desired operating parameters.

Analog to Digital Converter

In certain embodiments of the present invention, the controller can be selected to include a 12 bit, successive approximation register, sample/hold based ADC. The analog inputs can be configured or re-mapped to digitize internal and external signals.

The currents for each phase can be input to the ADC. The ADC can convert this to digitized information that is used to calculate energy data. A periodic sampling timer can be used to create a phase locked loop (PLL) which generates a fixed sampling pulse, for example at 480 Hz. In some embodiments, the ADC can be configured to perform a conversion over 13 ADC clocks at ~5 MHz in which case, the samples may be largely decimated in software rather than sampling at lower rates.

Battery Voltage

The voltage of the battery 8 indirectly represents the state of charge of the battery. To determine the amount of energy available to the system 2, the battery status can be measured. In alternate embodiments, the controller can also make use of a "gas gauge" integrated circuit in-line with the battery for better granularity of battery state of charge.

In certain embodiments of the present invention, the voltage of the battery (~4V) can exceed the input range of the ADC. A simple low power resistive divider can be used; for example 50% of the battery voltage for input to the ADC. The input impedance of the ADC sample and hold stage results in an RC time constant to charge the input capacitor sufficiently to represent the battery voltage. For example, in one embodiment this time was calculated to be ~45 ms based on a 4 MΩ total resistance. In alternate embodiments, when measuring the battery is not required, a FET based power switch may be used to select when the battery divider is used.

Internal Temperature

In certain embodiments, the internal temperature of the system 2 may be measured. The internal temperature may be used as a purely diagnostic value to ensure that the outputs of the system's metering mode can be considered valid. In some cases, a maximum internal temperature may be set above which the system's readings are not considered valid. For instance, in some embodiments if the system's temperature exceeds 70° C. the values shown may be considered invalid. The maximum internal temperature may be selected based on the characteristics of the components in a particular embodiment. Temperature variances may also contribute to a calibration algorithm in firmware.

½VCC Monitoring

In certain embodiments of the present invention, VCC level can be measured as another purely diagnostic value to compare the regulator output status against an internal reference. The internal reference may be stored within the controller. This may be an important metric as the per-input reference voltage can be taken directly from the regulator output which is set to the VCC voltage. This can be used to effectively represent the "health" of the phase current samples.

Protection

Harvest Circuit

As discussed above with reference to FIG. 11, a noise filter can be used to protect system components from high speed transient noise as well as wideband noise.

Boost Circuit

In certain embodiments of the present invention, the boost circuit front end of the energy harvesting circuit may provide a form of self-protection. Some basic scenarios that can be protected against are:

(i) current inrush on the charge pin, and (ii) overvoltage on the charge pin (due to the harvesting controller "wake up" time).

In both cases (i) and (ii) in the previous paragraph, a TVS or transient voltage suppressor can be implemented as a mitigation mechanism. This essentially limits the peak voltage (not the energy) of an overvoltage or overcurrent event. In the example embodiment shown, the standoff voltage of the diode is 3V which is far less than the 6V maximum of the CHG pin thus ensuring conduction at excessive voltages.

Human-Machine Interface

LCD Display and Pushbuttons

Figure 20:
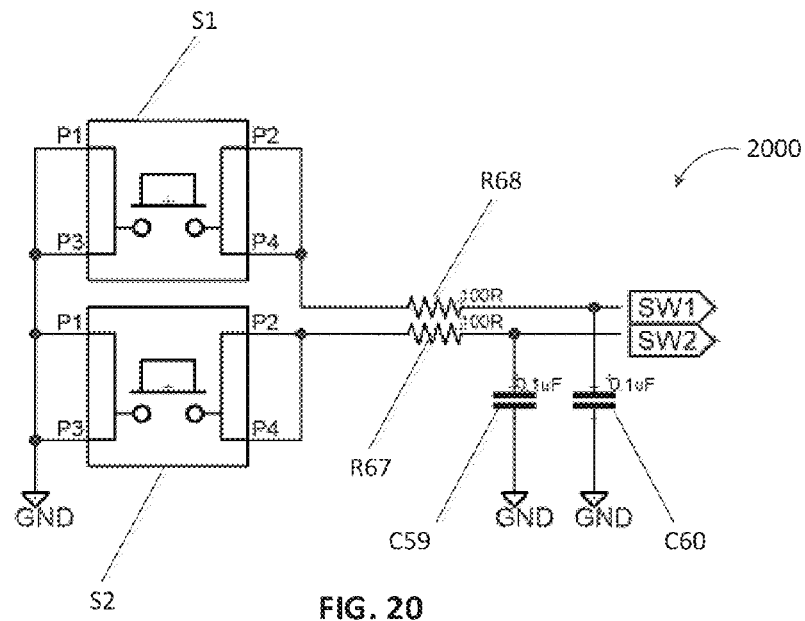
FIG. 20 is a circuit diagram of example push buttons and de-bounce circuit of the meter of FIG. 1.

In some embodiments, the LCD may serve two functions to a user physically located within proximity of the meter:

(i) The LCD can display relevant energy, status and configuration details such as kWh, $, time, Tx, Rx, battery level, pairing status, error codes, RF RSSI/SNR, charge status, and debug/maintenance mode;

(ii) The LCD may also allow for guided configuration of the meter's operational parameters (e.g. wireless link, phase configuration) during installation and commissioning efforts Referring to FIG. 20, shown therein is an example circuit diagram 2000 of push buttons and a de-bounce circuit of the meter. The two pushbuttons can serve multiple functions depending on the length of a button press. For example, the pushbuttons can be configured as follows:

Button #1:

Short press: Manual Transmit

Long press: Pair/Unpair

Button #2:

Short press: Cycle information on LCD

Long press: Reset info. (i.e. reset displayed kWh counter)

LCD

Figure 19:
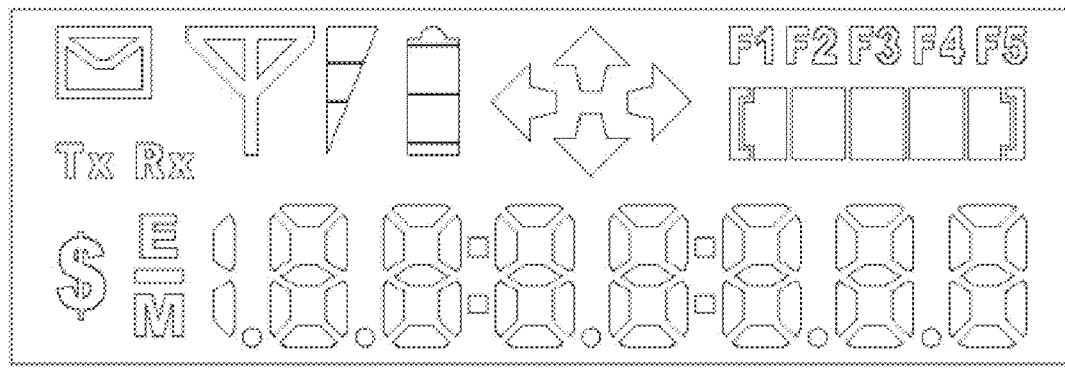
FIG. 19 is an example LCD display of the meter of FIG. 1.

Referring to FIG. 19, in certain embodiments of the present invention, an LCD display 1900 can be provided. An example of an LCD power display that can be used is the Softbaugh SBLCDA4. The SBLCDA4 is a reflective, low power display with a 4 way multiplexed common pin-set. The controller may include a built-in LCD controller to provide the reference levels, refresh rates and biasing required to operate the LCD display.

The pushbuttons S1 and S2 can also provide user sourced, interrupt-based control of the controller. They can be de-bounced in hardware with a 100Ω resistor and a 100 nF capacitor for a time constant of 10 μs or 100 kHz.

Software selectable pull-ups within the controller's inputs can be used on the SW1 and SW2 traces when the system 2 is in active mode. This can ensure that when a pushbutton is pressed, the corresponding input is connected to ground, generating a hardware interrupt.

Antenna

In certain embodiments of the present invention, the system 2's antenna can be based on the Texas Instruments design notes DN031 and DN024. In some cases, a meandering PCB antenna can used since it offers the greatest gain vs. cost vs. board area tradeoff in the 868-955 MHz ISM bands. These bands may be selected as they allow for use in international Regions 1 and 2.

In some embodiments, a fixed impedance SMA connection can be added. In such embodiments, with R63 populated and the trace cut on the PCB antenna, any off-the-shelf 900 MHz antenna can be used.

Auxiliary Power Input

During the firmware development, an auxiliary power input may be required if the harvesting source is insufficient to run the system indefinitely or is unavailable.

Figure 21:
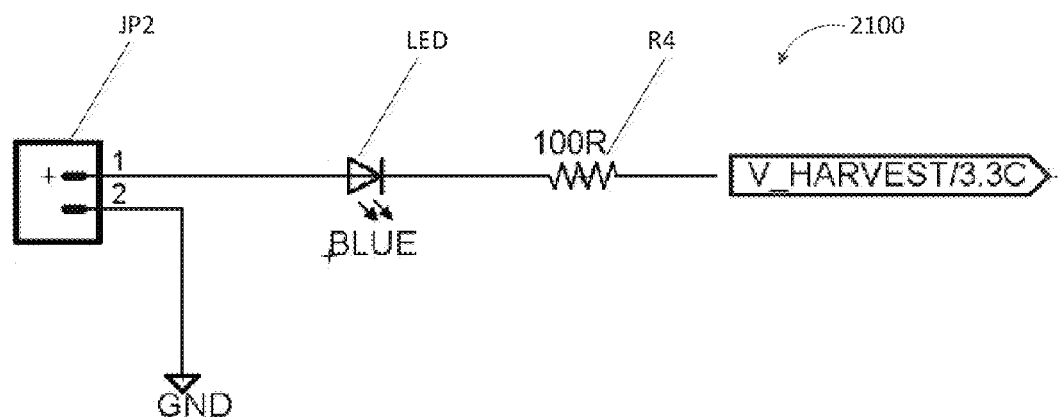
FIG. 21 is a circuit diagram of an example auxiliary power input and indication LED of the meter of FIG. 1.

Referring to FIG. 21, shown therein is an example circuit diagram 2100 of an auxiliary power input and indication LED of the meter. In the embodiments shown, J2 allows for a 5V input to the meter to charge the battery and provide auxiliary power. The energy harvester has a shunt current input limit of 50 mA, the LED and 100Ω resistor provide a current limit and voltage drop such that the harvesting system will not be damaged due to excessive power dissipation.

The approximate voltage output of this circuit may depend on the battery voltage but in embodiments it may be determined as follows:

$$V_{HARVEST} = V_{AUX} - I_{AUX} \times R$$

For example:

$$V_{HARVEST} = 5V - 3.3V - 5\text{ mA} \times 100\ \Omega = 1.2V$$

JTAG

The JTAG connection may follow recommended design guidelines for the protocol and controller type. Resistors allowing for internally sourced vs. externally sourced JTAG power can be placed upon the board depending on development requirements. Additionally, another resistor can be placed but not populated on the board to allow for future reduction in JTAG pin-out.

According to one aspect of the present disclosure, there is provided an electrical current measuring apparatus including a magnetically coupled current transformer attachable to an electrical wire, a dynamic power switch connected to the current transformer, an energy harvester, power manager connected to the dynamic power switch, a low power controller for controlling the switch between a harvesting mode and a metering mode, and a battery. The electrical current measuring apparatus may further include an analog front end connected between the switch and the controller.

According to another aspect of the present disclosure, there is provided an electrical current measuring apparatus including a magnetically coupled current transformer attachable to an electrical utility wire, a dynamic power switch connected to the current transformer comprising a harvesting mode and a metering mode, an energy harvester and power manager connected to the dynamic power switch, an energy storage medium connected to the dynamic power switch, and, a controller connected to the energy harvester and power manager for controlling the operation of the measuring apparatus, including controlling switching between the harvesting mode, wherein current drawn from the utility wire via the coupled current transformer is directed to the energy storage medium to charge the energy storage medium, and the metering mode wherein current drawn from the utility wire is measured. The apparatus may further comprise a wireless transceiver connected to the microprocessor for transmitting current measurements from the utility wire to a network. In the apparatus, the controller may further be adapted, upon detection a low energy level in the energy storage medium by the energy harvester and power manager, to cause the dynamic power switch to switch from the metering mode to the harvesting mode.

According to another aspect of the present disclosure, there is provided a method for electrical current measurement including drawing power from an electrical utility line via a magnetically coupled current transformer attached the electrical utility line, measuring the current in the utility line, providing an energy storage medium connected to the coupled current transformer, upon detecting a low energy storage level in the storage medium, automatically diverting current from metering to the storage medium to charge the storage medium.

The present invention has been described here by way of example only. Various modification and variations may be made to these exemplary embodiments without departing from the spirit and scope of the invention, which is limited only by the appended claims.

I claim:

1. An apparatus for electrical current measurement, the apparatus comprising:
   a power input providing one of AC and DC power, wherein the power input is a transformer adapted to be coupled to a utility wire providing an intermittent load;
   a dynamic switch coupled to the power input;
   an energy harvesting circuit coupled to the dynamic switch, wherein the energy harvesting circuit comprises an energy storage medium and the energy harvesting circuit is configured to charge the energy storage medium using current received from the power input;
   an energy metering circuit coupled to the dynamic switch, the energy metering circuit configured to measure the load provided by the utility wire using a differential signal of the received current; and
   a controller coupled to the dynamic switch, the controller having at least an inactive state and an active state, and the controller is operable to control switching of the dynamic switch when the controller is in a state other than the inactive state; wherein
   the dynamic switch is configured to activate one of the energy harvesting circuit and the energy metering circuit, and deactivate the other;
   the dynamic switch is configured to activate the energy harvesting circuit to charge the energy storage medium from the load provided by the utility wire when the controller is in the inactive state and in the absence of external control; and
   the dynamic switch comprises a differential switch unit positioned between the power input and the energy metering circuit, the differential switch unit having a first pair of MOSFET transistor switches on a first signal line between the energy metering circuit and the power input, and a second pair of MOSFET transistor switches on a second signal line between the energy metering circuit and the power input, wherein a differential between the signals on the first signal line and the second signal line defines the differential signal of the received current.

2. The apparatus of claim 1, wherein the power input is a current transformer adapted to be magnetically coupled to the utility wire.

3. The apparatus of claim 1, wherein the energy storage medium is a solid state lithium cell.

4. The apparatus of claim 1, wherein the controller is coupled to the energy storage medium, and the energy storage medium is configured to provide power to the controller.

5. The apparatus of claim 4, further comprising:
   a voltage regulator coupled to the controller, the energy harvesting circuit, and the energy metering circuit, the voltage regulator being operable to provide a regulated source of power for the controller and the energy metering circuit.

6. The apparatus of claim 5, further comprising:
   a voltage divider coupled between the voltage regulator and the energy harvesting circuit, the voltage divider being configured to ensure a minimum energy level in the energy storage medium prior to activating the voltage regulator.

7. The apparatus of claim 6, wherein the energy harvesting circuit is configured to automatically activate the voltage regulator when the minimum energy storage level is reached.

8. The apparatus of claim 5, wherein the controller is further configured to operate in a sleep mode.

9. The apparatus of claim 8, wherein:
when the controller is in the active mode, the voltage regulator is operable to provide a regulated source of power for the controller; and
when the controller is in the sleep mode, the controller is powered directly from the energy harvesting circuit.

10. The apparatus of claim 8, wherein the voltage regulator has a high power regulation mode operable when the controller is in the active mode and a low power regulation mode operable when the controller is in the sleep mode.

11. The apparatus of claim 10, wherein the voltage regulator has a maximum current draw of 50 μA in the low power regulation mode.

12. The apparatus of claim 10, wherein the voltage regulator has a maximum current draw of 400 mA in the high power regulation mode.

13. The apparatus of claim 8, further comprising a wireless transceiver;
wherein the controller is operable to receive a wireless wake command and to switch operation of the controller from the sleep mode to the active mode upon receiving the wake command.

14. The apparatus of claim 1, wherein the energy harvesting circuit further comprises:
a harvest controller coupled to the energy storage medium; and
a voltage rectifier coupled to the harvest controller; and wherein
the voltage rectifier is configured to rectify the received current into pulsed DC current and supply the pulsed DC current to the harvest controller; and
the harvest controller is configured to charge the energy storage medium using the pulsed DC current.

15. The apparatus of claim 14, wherein the energy harvesting circuit further comprises:
a boost converter coupled between the voltage rectifier and the harvest controller, the boost converter configured to boost an input voltage of the pulsed DC current prior to supplying boosted DC current to the energy storage medium.

16. The apparatus of claim 1, wherein the energy metering circuit comprises an analog front end configured to measure the differential signal of the received current.

17. The apparatus of claim 16, wherein the analog front end comprises a noise suppression and protection circuit.

18. The apparatus of claim 16, wherein the analog front end comprises a burden resistor and the analog front end is configured to measure a voltage signal across the burden resistor.

19. The apparatus of claim 18, wherein the analog front end further comprises a voltage bias circuit to bias the measured voltage signal to a ground referenced voltage signal.

20. The apparatus of claim 16, wherein the analog front end further comprises a voltage amplifier.

21. The apparatus of claim 16, wherein the analog front end further comprises an anti-aliasing filter.

22. The apparatus of claim 16, wherein the dynamic switch comprises a plurality of independent power switch units.

23. A system comprising a plurality of apparatuses as defined in claim 1, wherein each of the apparatuses further comprises a wireless transceiver and is operable to wirelessly communicate with at least one of the other apparatuses.

24. The system of claim 23 further comprising:
a data concentrator that is operable to wirelessly communicate with at least one of the apparatuses;
wherein
the plurality of apparatuses are configured to relay information from each of the apparatuses to the data concentrator.

25. The apparatus of claim 1, wherein the dynamic switch comprises a differential analog switch that is operable to switch between a closed position in which the energy harvesting circuit is active and an open position in which the energy harvesting circuit is inactive.

26. An apparatus for electrical current measurement, the apparatus comprising:
a power input providing one of AC and DC power;
a dynamic switch coupled to the power input;
an energy harvesting circuit coupled to the dynamic switch, wherein the energy harvesting circuit comprises an energy storage medium and the energy harvesting circuit is configured to charge the energy storage medium using current received from the power input;
an energy metering circuit coupled to the dynamic switch comprising an analog front end configured to measure a differential signal of the received current; and
a controller coupled to the dynamic switch, the controller operable to control switching of the dynamic switch;
wherein the dynamic switch is configured to activate one of the energy harvesting circuit and the energy metering circuit, and deactivate the other and the dynamic switch is configured to activate the energy harvesting circuit to charge the energy storage medium in the absence of an active controller;
wherein the energy metering circuit further comprises an analog-to-digital converter (ADC) electrically coupled to the analog front end, the ADC configured to digitize the measured differential signal from the analog front end; and
the dynamic switch comprises a differential switch unit positioned between the power input and the energy metering circuit, the differential switch unit having a first pair of MOSFET transistor switches on a first signal line between the energy metering circuit and the power input, and a second pair of MOSFET transistor switches on a second signal line between the energy metering circuit and the power input, wherein a differential between the signals on the first signal line and the second signal line defines the differential signal of the received current.

27. The apparatus of claim 26, wherein the ADC has a sampling rate of n times a nominal utility frequency where "n" is an integer.

* * * * *